(12) United States Patent
Errato, Jr. et al.

(10) Patent No.: US 10,757,830 B1
(45) Date of Patent: Aug. 25, 2020

(54) POWER MANAGEMENT AND DISTRIBUTION SYSTEM AND METHOD

(75) Inventors: Andrew Errato, Jr., Milford, CT (US); Tyrone Mellon, Bridgeport, CT (US)

(73) Assignee: LEX PRODUCTS CORP, Shelton, CT (US)

( * ) Notice: Subject to any disclaimer, the term of this patent is extended or adjusted under 35 U.S.C. 154(b) by 585 days.

(21) Appl. No.: 13/418,023

(22) Filed: Mar. 12, 2012

Related U.S. Application Data

(60) Provisional application No. 61/452,012, filed on Mar. 11, 2011.

(51) Int. Cl.
*H02J 3/26* (2006.01)
*H05K 7/20* (2006.01)

(52) U.S. Cl.
CPC ......... *H05K 7/20145* (2013.01); *H05K 7/205* (2013.01); *H05K 7/20545* (2013.01); *H05K 7/20572* (2013.01)

(58) Field of Classification Search
CPC ................ H03J 3/14; H03J 3/26; Y02E 40/50
USPC ............... 307/11–42, 66; 323/901; 361/2–13
See application file for complete search history.

(56) References Cited

U.S. PATENT DOCUMENTS

| | | | | |
|---|---|---|---|---|
| 4,356,525 A | * | 10/1982 | Kornrumpf | H01H 9/542 361/13 |
| 5,852,554 A | * | 12/1998 | Yamamoto | H02M 7/493 363/71 |
| 6,018,203 A | * | 1/2000 | David | H02J 3/14 307/52 |
| 6,643,112 B1 | * | 11/2003 | Carton et al. | 361/152 |
| 7,242,110 B2 | * | 7/2007 | Matsumoto et al. | 307/14 |
| 2002/0093774 A1 | * | 7/2002 | Chung | H01H 9/542 361/2 |
| 2010/0033887 A1 | * | 2/2010 | Fong | 361/91.1 |
| 2010/0226160 A1 | * | 9/2010 | Prior | H01H 47/002 363/132 |
| 2012/0092060 A1 | * | 4/2012 | Ganesan | 327/419 |

* cited by examiner

*Primary Examiner* — Rexford N Barnie
*Assistant Examiner* — Toan T Vu
(74) *Attorney, Agent, or Firm* — Steven M. McHugh

(57) ABSTRACT

A system and method for managing and distributing power is provided, wherein the system includes an electrical power input for receiving three-phase power from an external power source, a first electrical power outlet and a second electrical power outlet. The system further includes current measuring components configured to measure the current on all phases of electrical power being drawn by electrical loads connected to the first electrical power outlet and the second electrical power outlet. The system also includes a processing device to analyze measured current for all phases of electrical power being drawn by the electrical loads. Furthermore, the system includes phase balancing components configured to modify the current for each of the phases of the electrical power being drawn by the electrical loads connected to the first electrical power outlet and the second electrical power outlet such that the current for each phase is substantially balanced.

18 Claims, 25 Drawing Sheets

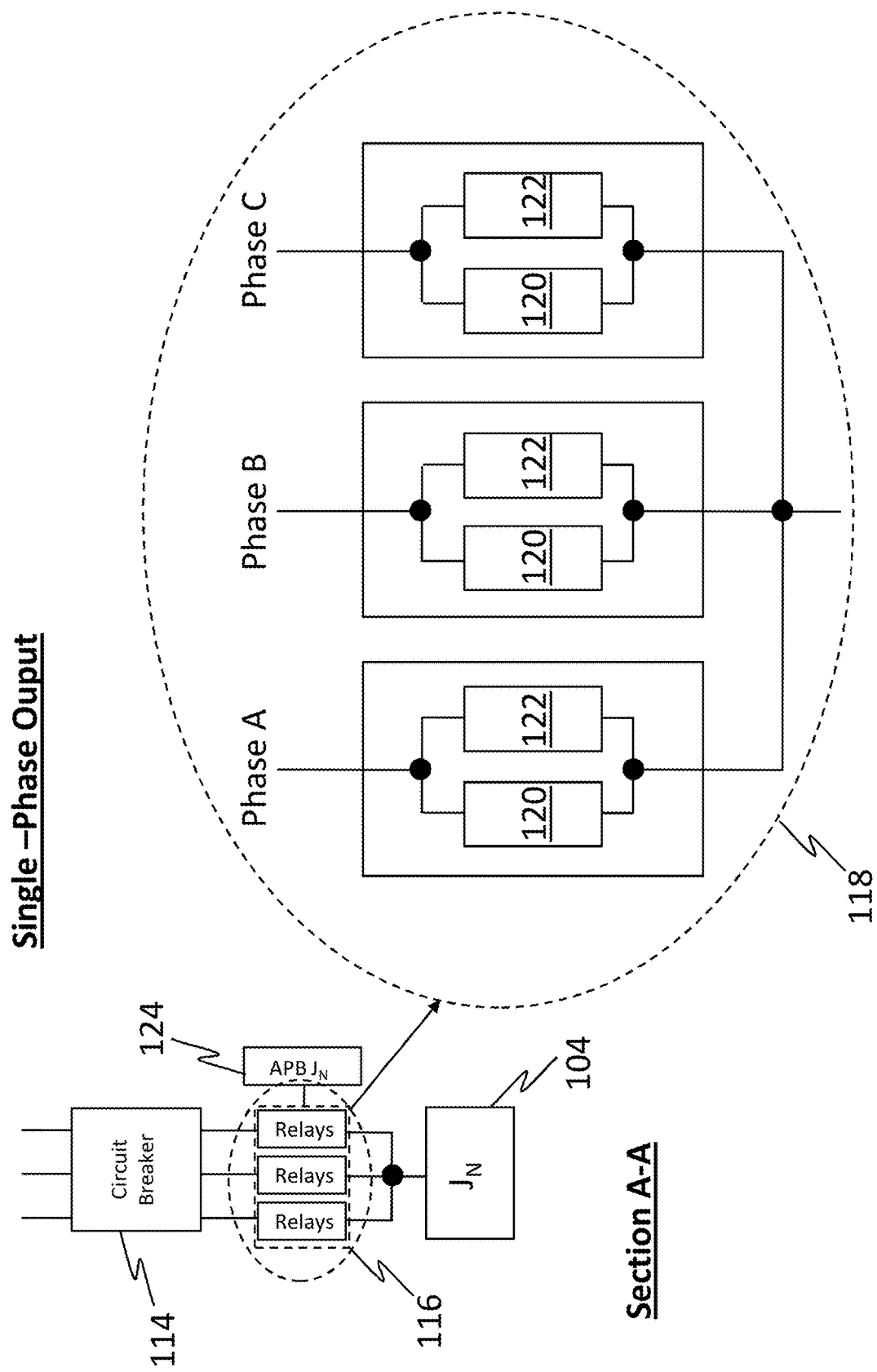

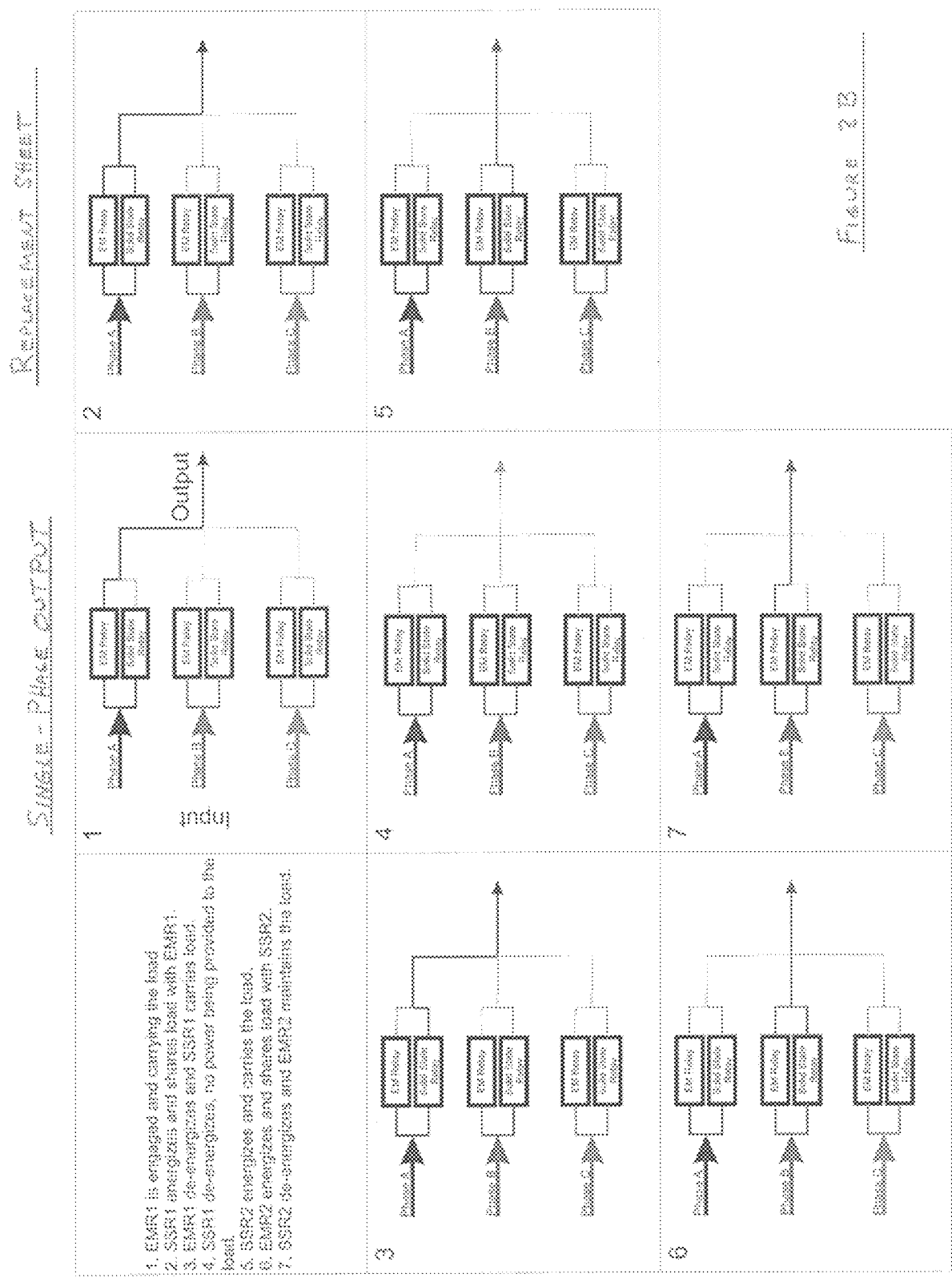

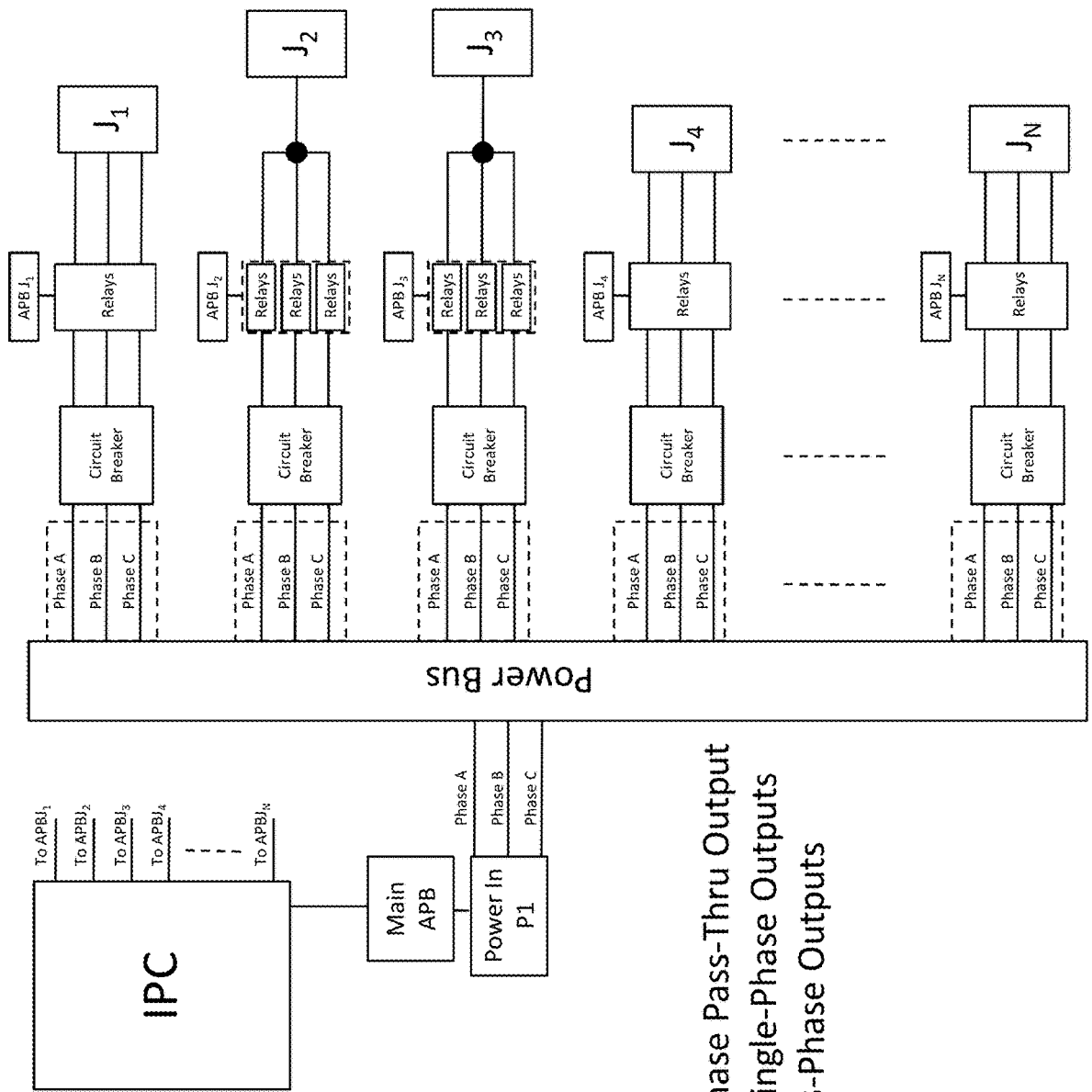

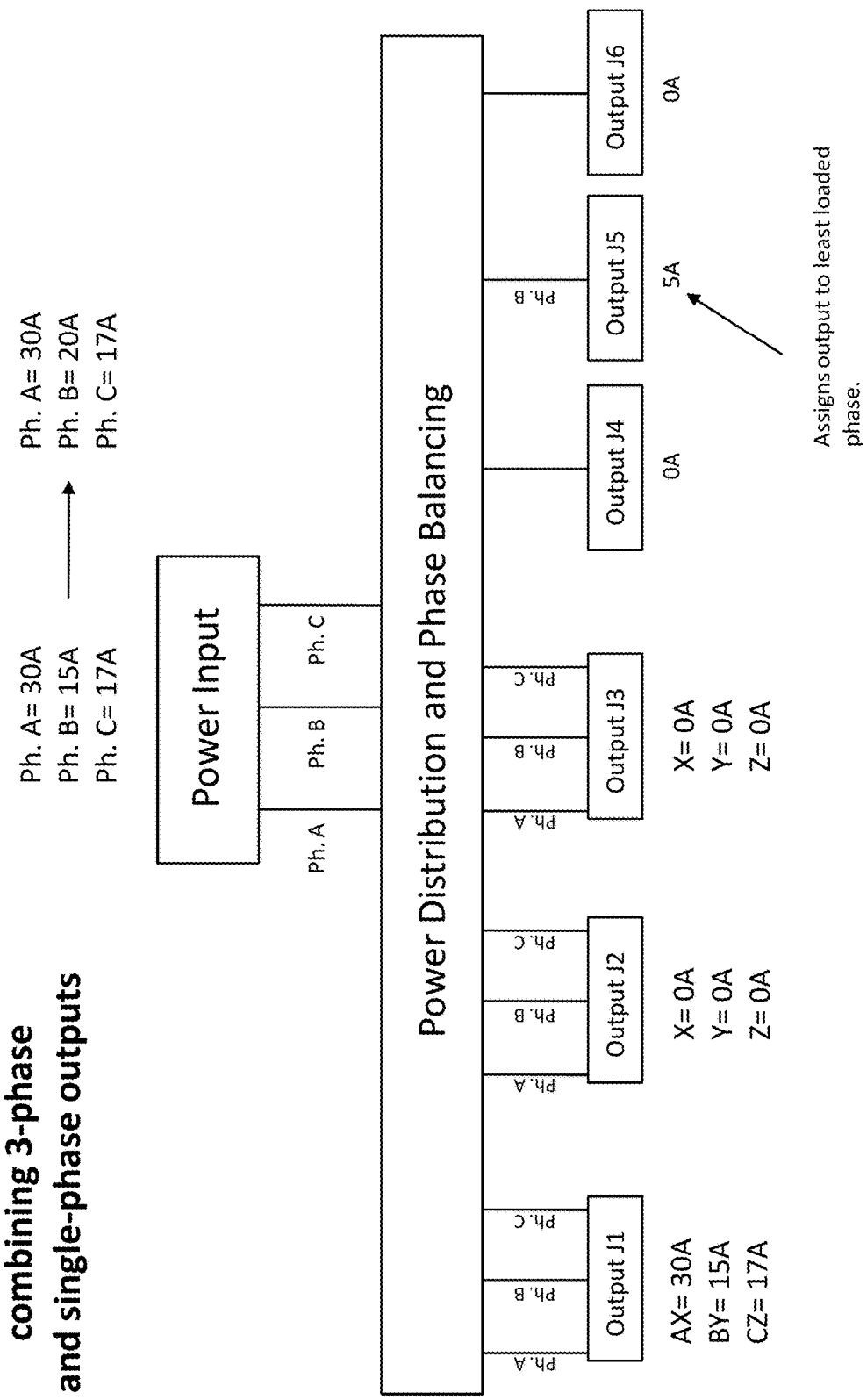

POWER MANAGEMENT AND DISTRIBUTION SYSTEM AND METHOD

RELATED APPLICATIONS

This application claims priority to and benefit of the filing date of U.S. Provisional Patent Application Ser. No. 61/452,012, filed Mar. 11, 2011, the contents of which are incorporated by reference herein in its entirety.

FIELD OF THE INVENTION

The present invention relates generally to a system for distributing power and more particularly to a system that manages and automatically balances the distribution of power to its output loads.

BACKGROUND OF THE INVENTION

Portable power distribution systems or units are well known in the art and are used to distribute power from a single (or multiple) power source to multiple systems or devices that have usually been set up in a temporary fashion. Typically, portable power distribution systems include at least one input for receiving three-phase electric power from a three-phase generator and a plurality of outputs for distributing the received power as three-phase and/or single-phase electric power. For applications that require power, such as emergency or military applications, these systems are necessary when connection to a stable power grid is not available and when multiple loads need to be connected to a temporary or alternative power source, such as a generator. For example, in military applications it is essential that the command post of a battlefield operation have a continuous supply of power to control weapon systems and operate the communication systems. Accordingly, it is imperative that the integrity of the power supply system remains intact.

Unfortunately however, the stability and reliability of current portable power distribution systems becomes questionable if the distribution system is not balanced. This imbalance is created when the current across all three phases are not equal (or substantially equal) and substantially more current is being drawn on one phase (or more phases) as opposed to the other phases. This imbalance is undesirable because it causes the devices attached to the system to operate less efficiently and can lead to several issues that create adverse situations, such as equipment damage and/or failure, safety hazards and complete power outages (including brownouts). It should be noted that although a perfectly balanced system is hard (if not impossible) to achieve, the more out of balance the system is, the more deleterious the effects are to the components (and performance of the components) connected to the system.

While there are methods to address these issues, many are not only inadequate, many times they are dangerous and impractical to employ. For example, one approach used to properly balance the electrical load across the phases of a generator requires that the attached devices be shutdown and reconnected to different phases. In an emergency medical or military situation, this may require the shutdown or complete disconnect of mission critical devices, such as weapon systems, communication and/or life support devices. Another approach would be to absorb the effects and address the power outages or brownouts that may result from the imbalance using Uninterruptable Power Supplies (UPS). Unfortunately, due to the typical power requirements of mission critical devices the UPS's are insufficient to cover these power outages.

SUMMARY OF THE INVENTION

The present invention provides a system and method for distributing power and more particularly a system and method for managing and automatically balancing the distribution of power to its output loads.

A power management and distribution system is provided and includes a power input configured to receive three-phase electrical power from an external power source, a first power output, a second power output and power handling means configured to, monitor the current for each phase of the three-phase power drawn by a first electrical load connected to the first power output and a second electrical load connected to the second power output, determine the total current drawn on each phase of the three-phase electrical power drawn by the first electrical load and the second electrical load and identify whether the total current is out of balance with respect to the current for each of the phases drawn by the first electrical load and the second electrical load and modify the current for each of the phases drawn by the first electrical load and the second electrical load such that the total current drawn is substantially balanced for each of the three-phases.

A power management and distribution system is provided and includes an electrical power input for receiving three-phase power from an external power source, a first electrical power outlet, a second electrical power outlet and a current measuring device for measuring the current on all phases of electrical power being drawn by electrical loads connected to the first electrical power outlet and the second electrical power outlet. The system further includes a processing device for analyzing the measured current for all phases of electrical power being drawn by the electrical loads and a phase balancing device for modifying the phase arrangement of the phases of the electrical power being drawn by the electrical loads connected to the first electrical power outlet and the second electrical power outlet such that the current for each phase is substantially balanced.

A method for managing and distributing power using a power management and distribution system is provided, wherein the power management and distribution system includes an electrical power input for receiving three-phase power from an external power source, a first electrical power outlet, a second electrical power outlet, a current measuring device for measuring the current on all phases of electrical power being drawn by electrical loads connected to the first electrical power outlet and the second electrical power outlet, a processing device for analyzing the measured current for all phases of electrical power being drawn by the electrical loads and a phase balancing device for modifying the current for each of the phases of the electrical power being drawn by the electrical loads connected to the first electrical power outlet and the second electrical power outlet such that the total current for each phase is substantially balanced across all phases. The method includes monitoring the current for each phase of the three-phase power drawn by a first electrical load connected to the first power output and a second electrical load connected to the second power output and determining the total current drawn on each phase of the three-phase electrical power drawn by the first electrical load and the second electrical load. The method further includes identifying whether the total current is out of balance with respect to the current for each of the phases drawn by the first electrical load and the second electrical load and modifying the current for each of the phases drawn by the first electrical load and the second electrical load such that the total current drawn is substantially balanced for each of the three-phases.

BRIEF DESCRIPTION OF THE DRAWINGS

The foregoing and other features and advantages of the present invention will be better understood from the following detailed description of illustrative embodiments, taken in conjunction with the accompanying drawings in which:

FIG. 3A is a schematic block diagram of one embodiment of the relays for single-phase outputs of the IPMDS of FIG. 2.

FIG. 3B is a schematic block diagram illustrating one embodiment of the operational flow of the relay for single-phase outputs of the IPMDS of FIG. 2.

FIG. 4 is a schematic block diagram of another embodiment of an intelligent power management & distribution system in accordance with the present invention illustrating power input(s) and multiple single-phase and three-phase power outputs.

FIG. 8C is a high level schematic block diagram an intelligent power management & distribution system illustrating the phase rotation example of FIG. 8A.

DETAILED DESCRIPTION OF THE INVENTION

Figure 1:
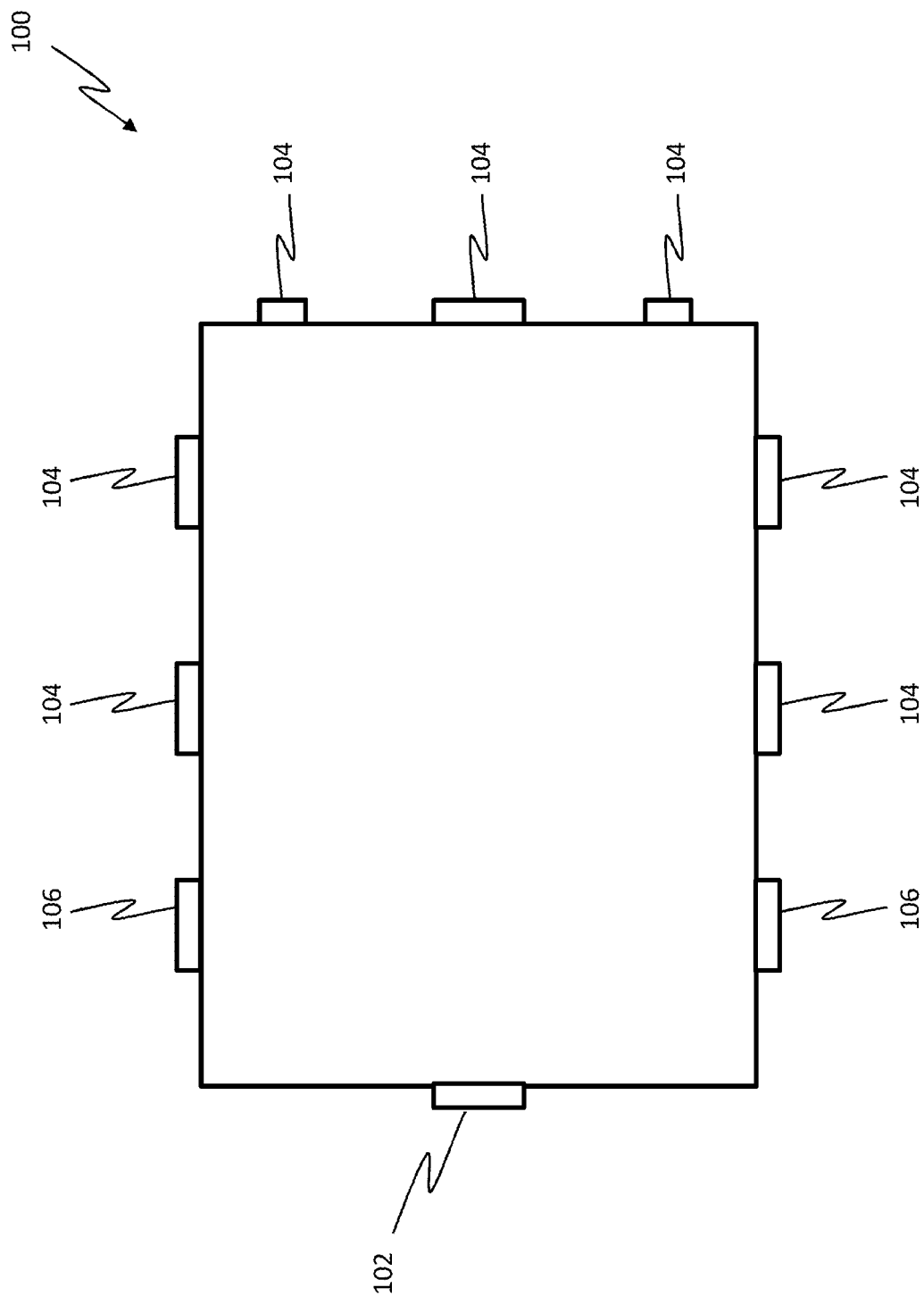
FIG. 1 is a high level general schematic block diagram of one embodiment of an intelligent power management & distribution system in accordance with the present invention.

In accordance with the present invention, an intelligent power management & distribution system is disclosed herein, wherein the power management & distribution system of the invention incorporates the method of the invention which includes a plurality of analytical approaches to identify a pattern of phase rotation, phase selection, load moves and/or load aging techniques to find "corner cases" that may be missed using conventional analytical approaches. In addition, the system and method of the invention checks for a variety of conditions, such as continuity issues, over-voltage issues and under-voltage issues. In one embodiment, the approach of the invention evaluates the state of balance of the system and expresses this balance as a scalar quantity, which in one embodiment is defined as the greatest difference between an individual phase current and the average of the three phase currents. This scalar quantity is referred to as "imbalance." This difference may then be scaled (in amps) and may typically range from 0 (perfect balance) of the maximum phase current (rating) of the circuit to 0.667 (maximum imbalance) of the maximum phase current (rating) of the circuit. For example, for one embodiment consider the situation where you have a load connected to a three-phase output. The current for each phase (i.e. phase A($\Phi_a$), phase B($\Phi_b$), phase C($\Phi_c$)) of the output is measured and subtracted from the average of the three phase current (rating) to determine the "imbalance". So for a 100 Amp three-phase circuit, a perfect balance may be defined as 0 Amperes while a worse case imbalance may be defined as ~67 Amperes.

It should be appreciated that the method of the invention may be conducted on a continuous basis, or it may be conducted on a periodic basis, as desired. For example, the analysis may be conducted each time a load is added to or subtracted from the system or the analysis may be conducted based on time intervals or it may be conducted as a result of changes in or to the loads attached to the system (which may be monitored). Once the imbalance of the circuit (and/or entire system) in question is determined, the system and method of the invention identifies the best approach to achieving the desired load balance via at least one of phase rotation, phase selection and/or load shedding. It should be appreciated that the phase rotation, phase selection and/or load shedding may be implemented separately or in combination with each other or other techniques.

In an exemplary embodiment, this balancing may be achieved by using a combination(s) of solid state and electromechanical relays to route the power between phases to allow the system of the invention to balance asymmetrically loaded outlets. Essentially, the solid state relays are used to take advantage of their quick response time and the electromechanical relays are used to take advantage of their low thermal characteristics. Accordingly, this approach is advantageous because there is almost no generation of heat from the electromechanical relays and the solid state relays do not require thermal management because of the small amount of time the solid state relays are used. This phase rotation capability provides for increased system efficiency, reduced nuisance circuit breaker activation and faster switching time with higher current handling features. Additionally, the phase selection capability also provides for increased system efficiency, reduced nuisance circuit breaker activation and faster switching time with higher current handling features. The phase selection further allows the system and method of the invention to balance single phase loads in a multiphase system, to reassign loads when individual phases are dropped and to assign single phase outlets to any phase available or desired. For example, in one embodiment, upon the loss of a phase (or a degradation of the phase), the intelligent power management & distribution system of the present invention may go into a 'battleshort' or shut-down mode. However, a user can override this mode to allow the devices attached to this power output to remain powered up. This ability may be advantageous in situations where the effects of shutting down attached devices would be more detrimental than keeping them powered up. Further, although phase direction is not necessarily altered in the embodiments described herein, it is contemplated that circuitry may be provided to achieve a phase direction change as desired.

Once the state of imbalance is determined, the process of evaluating loads and planning appropriate procedures may be accomplished by comparing results and/or measured values with standards and/or predefined parameters which may be fixed or changeable (i.e configurable) as desired and/or as applicable to the specific situation. Some of these parameters may include the amount of change in a load that may be necessary for the system of the invention to identify that load as a new load being added. Additionally, these parameters may include imbalance thresholds such as an acceptable amount of imbalance, zero test thresholds, criteria for evaluating unused ampacity of the system which may be used to limit certain operations (i.e. adding loads), and/or intervals for evaluating load balance. Additionally, loads may be prioritized (and thus may be acted upon) based on desired criteria and/or situation specific uses, such as the age of the load, and/or the importance of the load.

Referring to FIG. 1, a high level block diagram showing an exemplary embodiment of an intelligent power management & distribution system (IPMDS) 100 in accordance with the present invention is shown and includes at least one power input 102 and at least one power output 104, wherein the at least one power input 102 is connected to a power source (such as generator) and the at least one power output 104 is configured to be connected to a load (such as communication equipment, lighting, etc.). Furthermore, the IPMDS 100 may also include a variety of communication ports 106 as well as system control inputs/outputs and breaker access ports.

Figure 2:
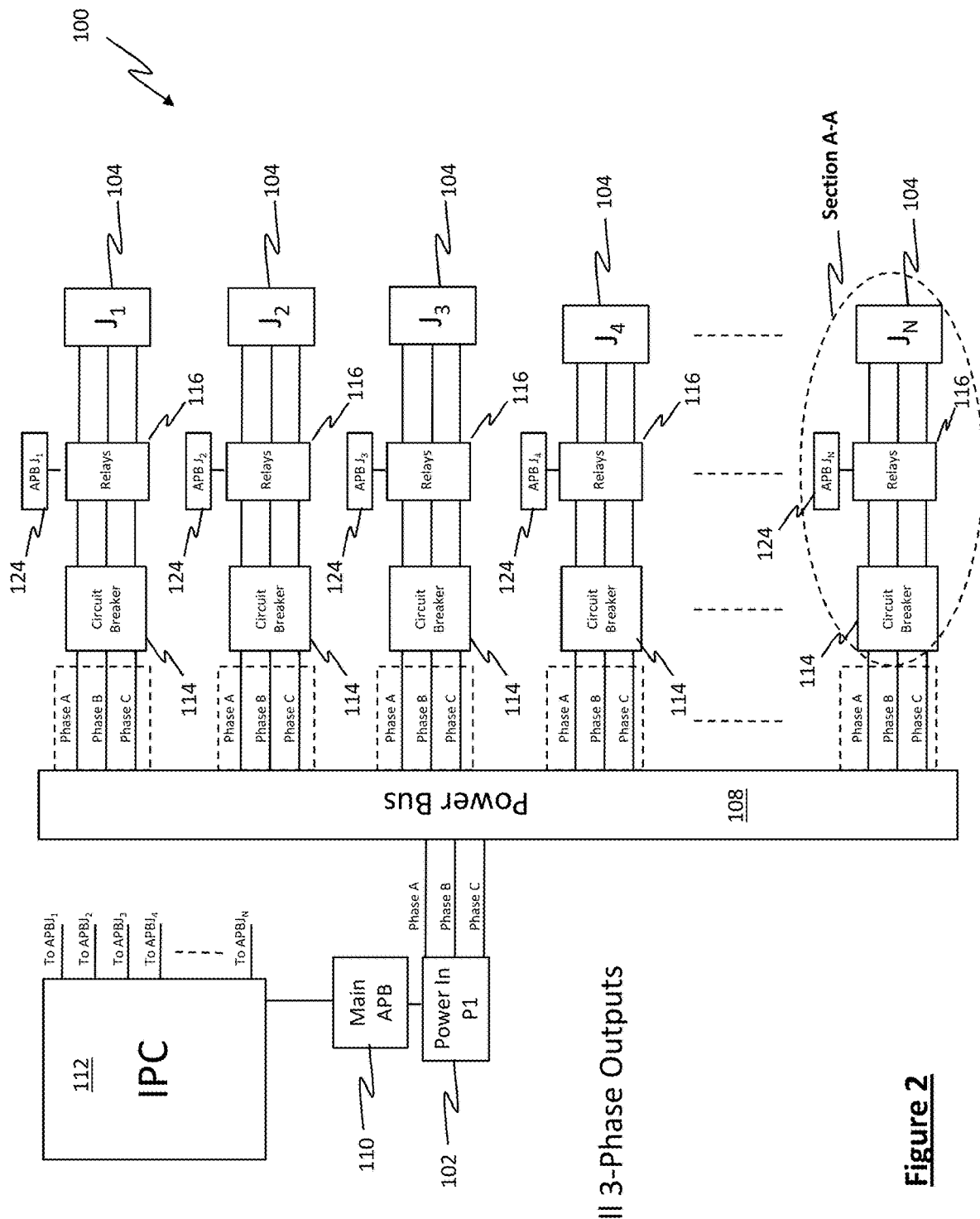
FIG. 2 is a schematic block diagram of one embodiment of an intelligent power management & distribution system in accordance with the present invention illustrating power input(s) and multiple three-phase power outputs.

Referring to FIG. 2, a schematic block diagram is provided and illustrates one embodiment of the electrical connection of the IPMDS 100 between the power input 102 and the power outputs 104, in accordance with the present invention. The power input (P1) 102 may be connected to a power bus 108 which distributes power throughout the IPMDS 100. The power input 102 is associated with a Main Auto-Phase Balancing module (MAPB) 110 (or circuitry) which is in signal communication with an Intelligent Power Controller 112 (IPC). The MAPB 110 monitors and measures the electrical and/or operational characteristics of the input power at the power input 102 and communicates these characteristics to the IPC 112, where the IPC 112 uses these characteristics for operation of the IPMDS 100. Each of the power outputs 104 is electrically connected to the power bus 108 via a circuit breaker 114 and a plurality of triple-pole relays 116, where the plurality of relays 116 includes solid state relays 120 and electromechanical relays 122, as shown in FIG. 3A. It should be appreciated that for single-phase power outputs 102, a relay pair 118 may be used as shown in FIG. 3A, where the invention includes a solid-state relay 120 and an electromechanical relay 122 for each phase of the electrical power at the power output 104. This advantageously allows for each phase to be connected or disconnected, as desired, from the load at the power output 104.

Referring to FIG. 3B, one embodiment of an operational flow for a single-phase output switching phases is illustrated. Referring to Operational Block 1, the electromechanical relay 122 (EMR1) for Phase A is engaged and is carrying the load. The solid-state relay 120 (SSR1) for Phase A is then energized and shares the load with EMR1 122, as shown in Operational Block 2. EMR1 122 is then de-energized and SSR1 120 is carrying the load, as shown in Operation Block 3. SSR1 120 is then de-energized and no power is being provided to the load, as shown in Operation Block 4. At this point, a second solid-state relay (SSR2) 120 for Phase B is energized and is carrying the load, as shown in Operational Block 5. The second electromechanical relay (EMR2) 122 is then energized and is sharing the load with SSR2 120, as shown in Operational Block 6. SSR2 120 is then de-energized and the load is being carried and maintained by EMR2 122, as shown in Operational Block 7.

Figure 3C:
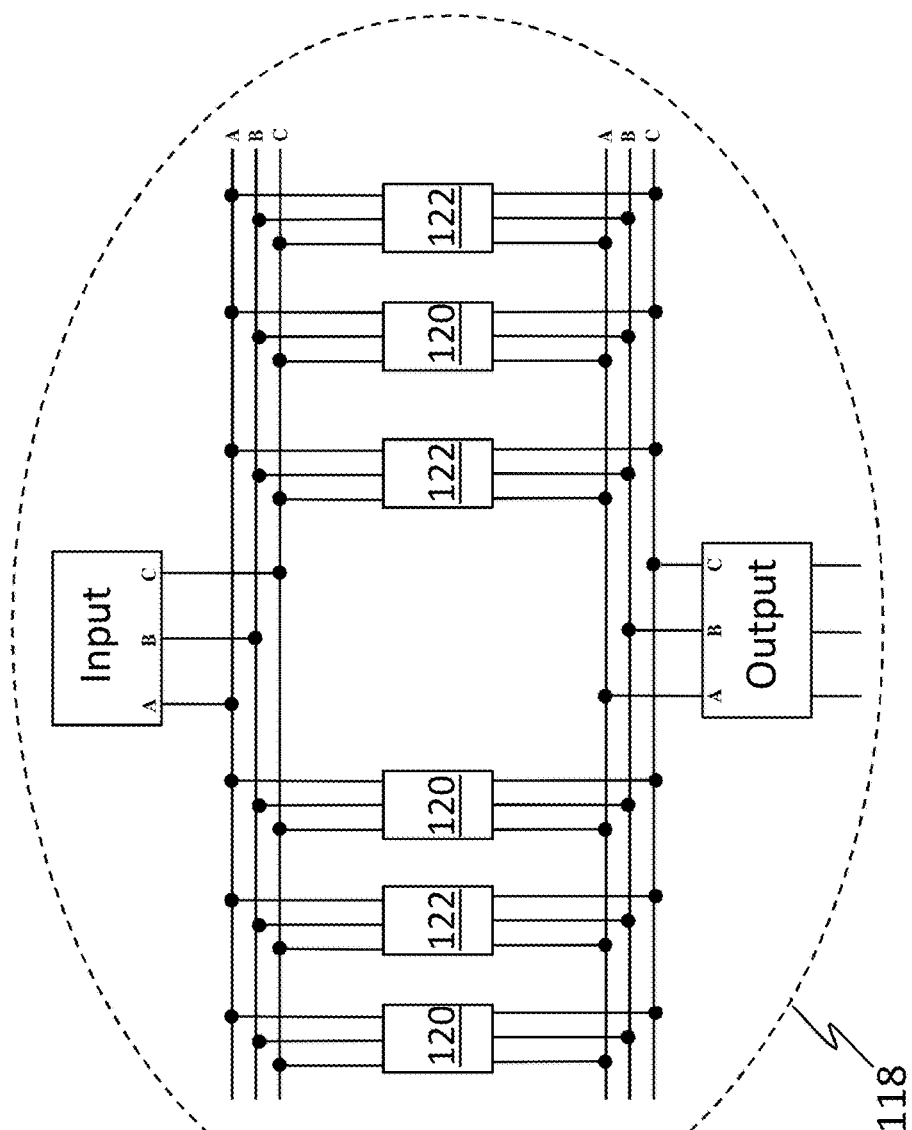
FIG. 3C is a schematic block diagram of one embodiment of the relays for 3-phase outputs of the IPMDS of FIG. 2.
Figure 3D:
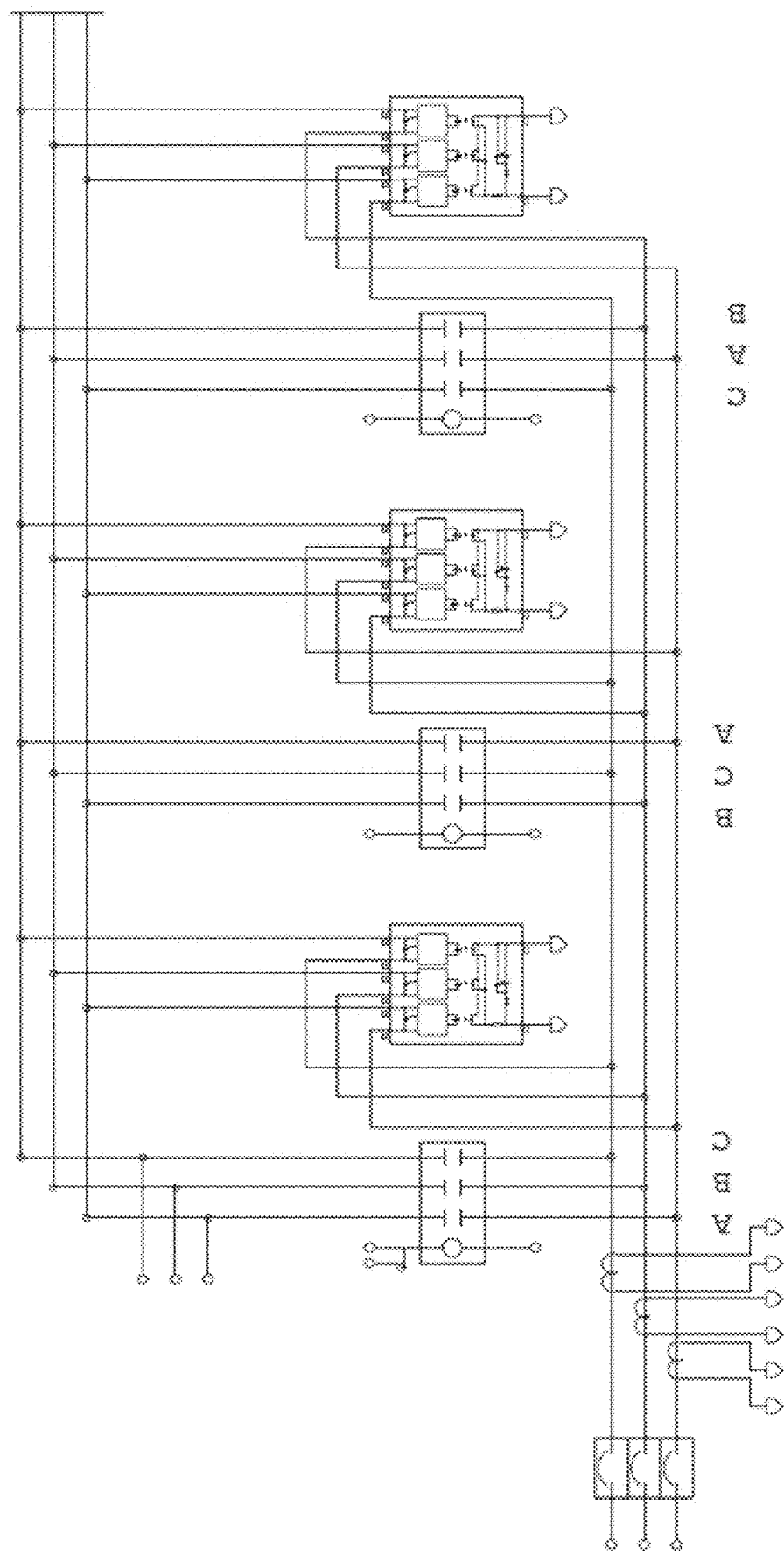
FIG. 3D is a schematic diagram of one embodiment of the relay for a 3-phase output of the IPMDS of FIG. 2.

For the 3-phase power outputs 102, the plurality of solid-state relays 120 and electromechanical relays 122 are preferably arranged to allow for a rotation or re-assignment of the three phases. For example, FIG. 3C and FIG. 3D illustrate one configuration of relays which includes three solid-state relays 120 and three electromechanical relays 122. This configuration advantageously allows for the phases to be rotated as desired and as described further herein with regards to examples.

Additionally, each of the power outputs 104 of the IPMDS 100 includes an output Auto-Phase Balancing modules (OAPB) 124 which monitors the electrical and/or load characteristics of the power output 104 and/or the load connected to the power output 104. The OAPB 124 is in electrical and/or signal communication with the IPC 112 and the plurality of relays 116 for its specific power output 104.

Accordingly, the OAPB 124 for a specific power output 104 monitors the electrical and/or load characteristics of that power output 104 and communicates this data to the IPC 112. The IPC 112 determines how that specific power output 104 should be configured responsive to other data of the IPMDS, such as the electrical and/or load characteristics of the other power outputs 104. The IPC 112 then instructs the OAPB 124 for that specific power output 104 to control (i.e. open/close) the relays 116 for that specific power output 104, as described in further detail hereinafter with regards to examples. It should be appreciated that although the present invention is described herein as having separate OAPB's 124 for each power output 104, it is contemplated that a single (or multiple) OAPB's 124 may be used to control each power output 104 separately.

It should be appreciated that the inputs 102 and outputs 104 of the IPMDS 100 may be configured in a variety of embodiments as desired. For example, FIG. 2 illustrates one embodiment of the IPMDS 100 where the input 102 and outputs 104 are configured as one three-phase power input 102 and multiple three-phase power outputs 104. As another example, FIG. 4 illustrates an additional embodiment of the IPMDS 100 where the input 102 and outputs 104 are configured with one three-phase power input 102 and multiple single-phase (J2, J3) and three-phase power outputs (J1, J4-JN) 104. It should be further appreciated that an output 104 can be configured for different currents and phases than the input power. For example, one output 104 can be configured for 40 A, 3-phase, while another output 104 can be configured for 20 A, single-phase, while still yet another output 104 can be configured as a pass-through output, allowing the load connected to the pass-through power output 104 to have the same electrical characteristic as the power source connected to the power input 102. For example, referring again to FIG. 4, consider the situation where power output J1 is configured as a pass-through output port. In this case, if the input power from the power source at the power input 102 is a three-phase, 100 Ampere, 208Y/120 VAC (with status enabled connector) input, the electrical ratings for the power output port J1 would be three-phase, 100 Ampere, 208Y/120 VAC. Also, output ports J2, J3 are configured for single-phase loads, while output ports J4-JN are configured for 3-phase loads (where J2-JN may be configured for lower current ratings).

It should be further appreciated that the IPMDS 100, IPC 112, MAPB 110, and/or the OAPB 124 may include a processing device and/or other components/circuitry configured to accomplish their functions as described herein. For example, the OAPB 124 may include a monitoring/sensing device to monitor and/or sense the phase current drawn by the loads attached to the power outputs 104, as well as circuitry to control the relays to implement phase adjustments as determined by the IPC 112. Additionally, the IPC 112 (IMPDS 100 in general) may include a processing device for analyzing the measured currents and determining a phase current configuration to achieve an optimal phase current balance (i.e. that which results in the least unbalanced configuration). This may occur on a periodic or constant basis. It should be further appreciated that an imbalance may be defined by a user as desired and/or for a specific application. For example, a user may define the parameters that are desired for the phase current (or these parameters may be predetermined).

Figure 5:
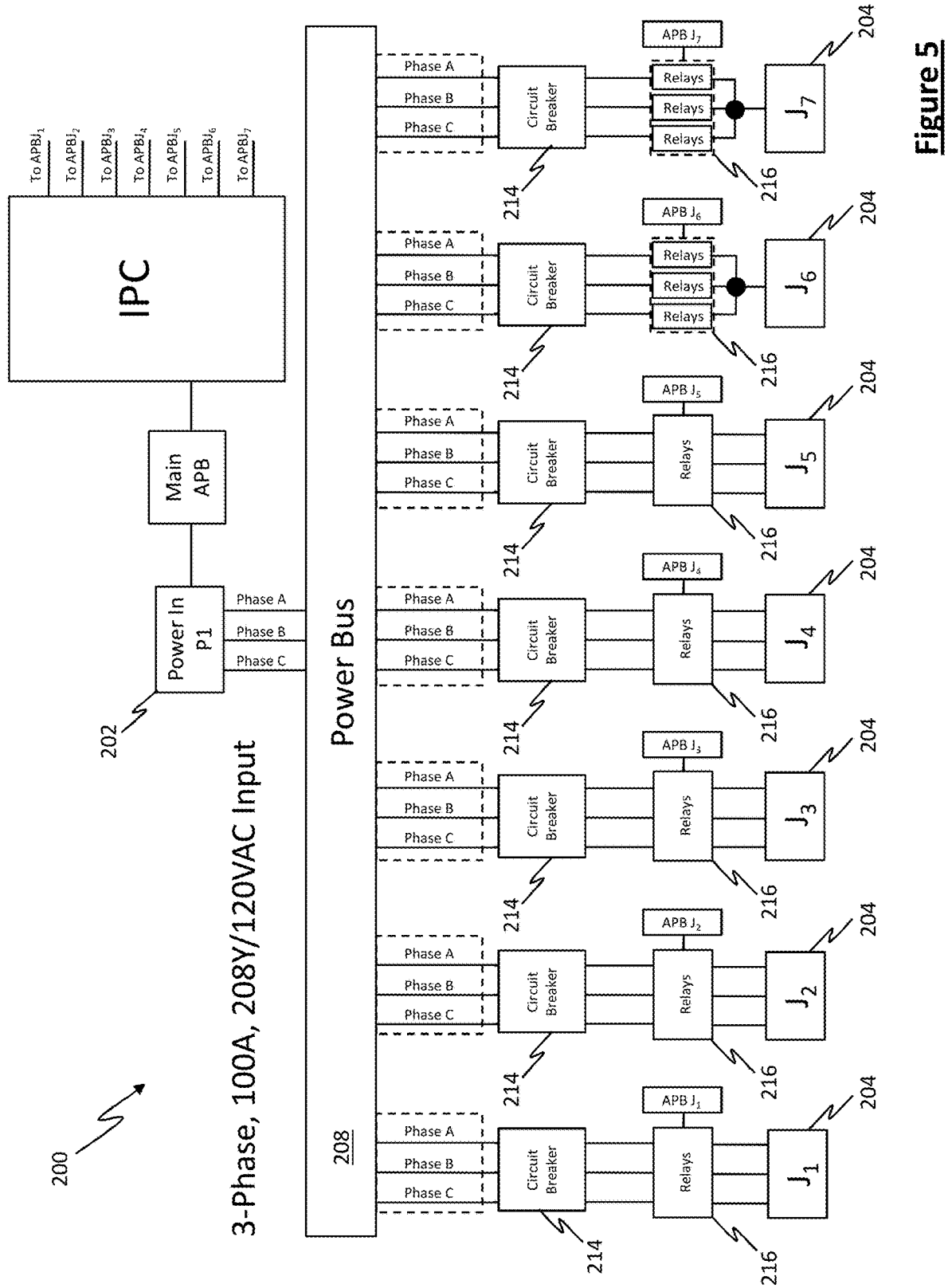
FIG. 5 is a schematic block diagram of another embodiment of the intelligent power management & distribution system configured for use with a 100 amp input, in accordance with the present invention.

Referring to FIG. 5, one embodiment of an IPMDS 200 for a 3-phase, 100 A, 208Y/120 VAC power input 202 and seven differently configured power outputs 204 is shown. As can be seen, the power input 202 is electrically connected to a power bus 208 which is electrically connected to seven power outputs 204 labeled as J1-J7 (more or less power outputs could be used if desired). Each of the phases (Phase A, Phase B, Phase C) at the power outputs 204 is connected to the power bus 208 via a plurality of relay 216 and a circuit breaker 214, where the plurality of relays includes solid state relays 120 and electromechanical relays 122 (See FIG. 3A, FIG. 3B and FIG. 3C). In this embodiment, power output J1-J7 204 are configured as follows:

| Power Connector | Power Rating of Output |
| --- | --- |
| J1 | Pass-Through 3-phase, 100A, 208Y/120VAC with Status Enabled Connector |
| J2 | 3-phase, 60A, 208Y/120VAC with Status Enabled Connector |
| J3 | 3-phase, 60A, 208Y/120VAC fixed-rotation with Status Enabled Connector |
| J4 | 3-phase, 40A, 208Y/120VAC with Status Enabled Connector |
| J5 | 3-phase, 40A, 208Y/120VAC with Status Enabled Connector |
| J6 | Single-phase, 20A, 120VAC |
| J7 | Single-phase, 20A, 120VAC |

Figure 6:
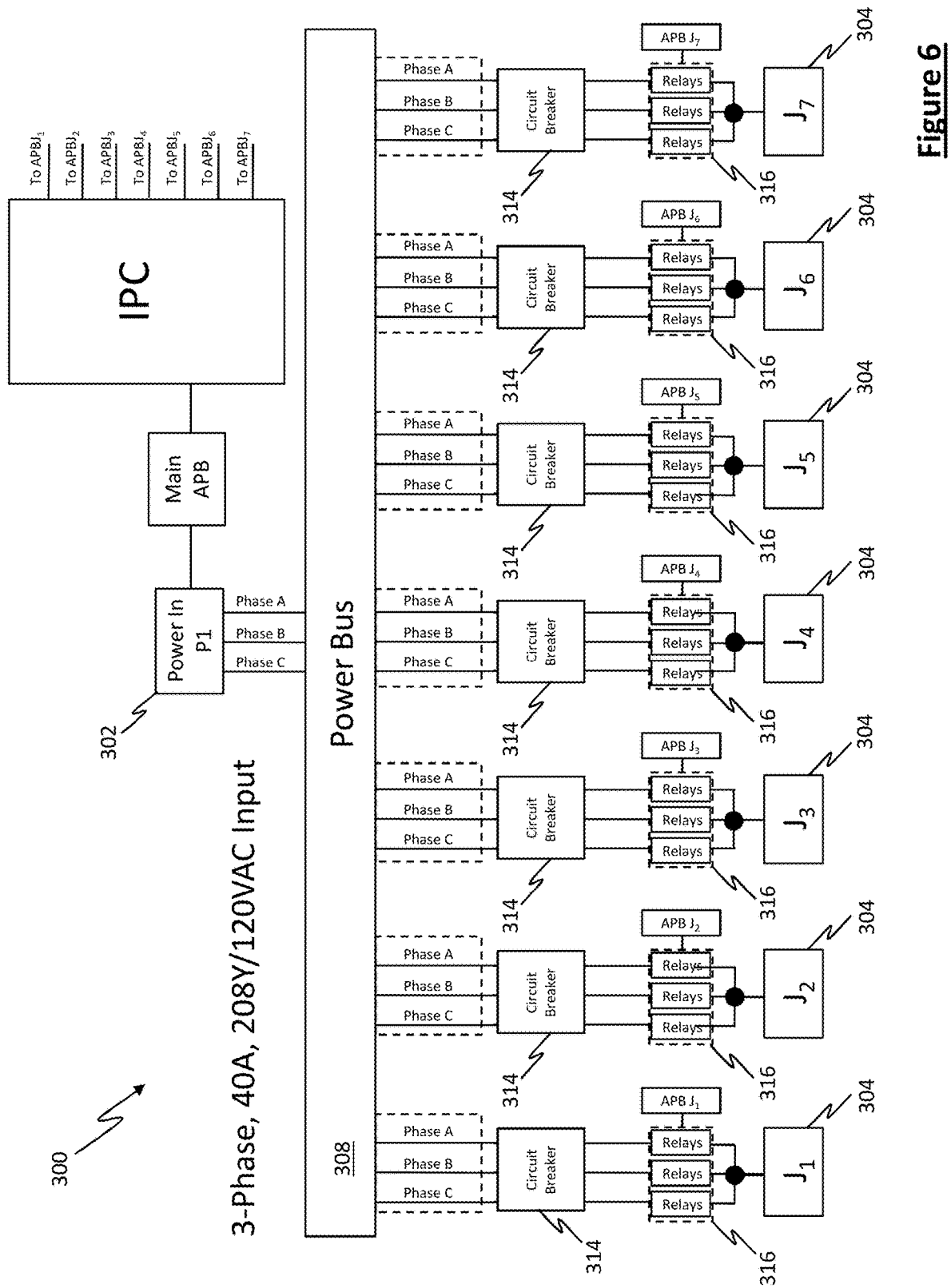
FIG. 6 is a schematic block diagram of another embodiment of the intelligent power management & distribution system configured for use with a 40 amp input, in accordance with the present invention.

Referring to FIG. 6, another embodiment of an IPMDS 300 for a 3-phase, 40 A, 208Y/120 VAC power input 302 and seven differently configured power outputs 304 is shown. As can be seen, the power input 302 is electrically connected to a power bus 308 which is electrically connected to seven power outputs 304 labeled as J1-J7 (more or less power outputs could be used if desired). Each of the phases (Phase A, Phase B, Phase C) at the power outputs 304 is connected to the power bus 308 via a plurality of relay 316 and a circuit breaker 214, where each of the plurality of relays includes solid state relays 120 and electromechanical relays 122 (See FIG. 3). In this embodiment, power output J1-J7 304 are configured as follows:

| Power Connector | Power Rating of Output |
| --- | --- |
| J1 | Pass-Through 3-phase, 40A, 208Y/120VAC with Status Enabled Connector |
| J2 | Single-phase, 20A, 120VAC |
| J3 | Single-phase, 20A, 120VAC |
| J4 | Single-phase, 20A, 120VAC |
| J5 | Single-phase, 20A, 120VAC |
| J6 | Single-phase, 20A, 120VAC |
| J7 | Single-phase, 20A, 120VAC |

In accordance with one embodiment of the invention, the overall method of the invention may include determining the balance of the IPMDS 100 (or individual power outputs 104) by examining the power characteristics (and/or load) of at least one of the power outputs 104 to determine a characteristic of the power and/or load at the power output(s) 104. This may include determining the current imbalance of the load at one or more of the power output(s) 104. Once the characteristic of the power and/or load is determined, the method of the invention optimizes the balance via at least one of a phase selection, phase rotation, load shedding and/or load moving based upon one or more desired parameters, some of which may be fixed and/or configurable by a user. As discussed hereinabove, it should be appreciated that during phase selection and/or phase rotation a combination of electromechanical relays 122 and solid state relays 120 are used to absorb and/or reduce the impact of the phase selection/rotation. For example, the method of the invention may determine when a phase rotation should occur. As current is being adjusted across the phases, the solid state relays 120 may have trouble absorbing the impact of the change. Accordingly, to address this issue, the solid state relays (SSR) 120 are active and used until the IPMDS 100 stabilizes at which point the electromechanical relays (EMR) 122 are activated (i.e. switched in) and the SSR's 120 are deactivated (i.e. switched out). This combination advantageously allows for the phase rotation and selection to occur very rapidly without any adverse effects to the IPMDS 100 or power distribution. Accordingly, the SSR's 120 engage during phase rotation or phase selection and once the phase rotation or phase selection is accomplished, the EMR's 122 engage (and the SSR's are turned off) to hold the load. It should be appreciated that the phase rotation or phase selection happens quickly, on the order of millisecond(s).

In accordance with one embodiment, one method of the implementing the IPMDS 100 may include one or more of the following operations and may be repeated on a continuous or a periodic basis as desired. For each iteration (or one or more) of the processing by the IPC 112, the IPMDS 100 may make a scratch copy of the system data and may then perform trial moves on the scratch data to solve overload and/or imbalance problems. Once the IPC 112 plots a set of moves using the scratch data, this set of moves may be executed by sending commands to the system hardware, such as the OAPB's 124 (this could also be wholly or partially handled manually). Accordingly, for each (or one or more) iteration, the system may perform one (or more) of the following tasks (which may be prioritized in the order listed):

If there is a fatal error, Kill Outputs (i.e. open all relay pairs 118)

Fatal errors may includes: Miswire, overvoltage, undervoltage, loss_of_phase, phase_order, freq_error, ground_error, and system_error.

If Input is overloaded, Fix Overload by:
1. Trying to fix overload by rotating loads:
    Rotation candidates may be identified with the following rules:
        Look for an unbalanced three-phase load whose lightest leg is on the lightest input phase. If multiple qualifying loads are found, take the one with the greatest imbalance. If one is found rotate it so its lightest leg goes to the heaviest input phase. Re-evaluate overload. If it is fixed, keep this move and quit. If it is better, keep this move and look for another. If it is not better, put the load back to its original rotation and look for another.
        Then, if the overload is still not fixed, look for an unbalanced three-phase load whose heaviest legs is on the heaviest input phase. If multiple qualifying loads are found, take the one with the greatest imbalance. If one is found rotate it so its heaviest leg goes to the lightest input phase. Re-evaluate overload. If it is fixed, keep this move and quit. If it is better, keep this move and look for another. If it is not better, put the load back to its original rotation and look for another.
        Then, if the overload is still not fixed, look for the smallest non-zero single phase load on the heaviest input phase. If one is found, it is rotated to put it on the lightest input phase. Re-evaluate overload. If it is fixed, keep this move and quit. If it is better, keep this move and look for another. If it is not better, put the load back to its original rotation and look for another.
2. If the input is still overloaded, fix overload by shedding loads:
    Shed candidates are identified with the following rules:
        Look for low priority loads to shed. If only one input phase is overloaded, look for single phase loads first, otherwise look for three phase loads first. Recently connected loads are preferred over older loads. If one is found, it is shut off. Reevaluate overload. If it fixed, leave this load off and quit. If it is better, keep this load off and look for another low priority load.
        If low priority loads are exhausted and the overload has not been fixed, look for normal priority loads to shed. If only one input phase is overloaded, look for single phase loads first, otherwise look for three phase loads first. Recently connected loads are preferred over older loads. If one is found, it is shut off. Re-evaluate overload. If it fixed, leave this load off and quit. If it is better, keep this load off and look for another normal priority load.
        If normal priority loads are exhausted and the overload has not been fixed, look for high priority loads to shed. If only one input phase is overloaded, look for single phase loads first, otherwise look for three phase loads first. Recently connected loads are preferred over older loads. If one is found, it is shut off. Re-evaluate overload. If it fixed, leave this load off and quit. If it is better, keep this load off and look for another high priority load.

If certain configuration changes have been made by user, it may be necessary to rotate a load to make it match the configuration. If so, Force Rotations.

If input is unbalanced, Fix Imbalance.
    Try to fix imbalance by rotating loads
    Rotation candidates are identified with the following rules:
        Look for an unbalanced three-phase load whose lightest leg is on the lightest input phase. If multiple qualifying loads are found, take the one with the greatest imbalance. If one is found, rotate it so its lightest leg goes to the heaviest input phase. Re-evaluate imbalance. If it is fixed, keep this move and quit. If it is better, keep this move and look for another. If it is not better, put the load back to its original rotation and look for another.
        Then, if the imbalance is still not fixed, look for an unbalanced three-phase load whose heaviest leg is on the heaviest input phase. If multiple qualifying loads are found, take the one with the greatest imbalance. If one is found rotate it so its heaviest leg goes to the lightest input phase. Re-evaluate imbalance. If it is fixed, keep this move and quit. If it is better, keep this move and look for another. If it is not better, put the load back to its original rotation and look for another.
        Then, if the imbalance is still not fixed, look for the smallest non-zero single phase load on the heaviest input phase. If one is found, it is rotated to put it on the lightest input phase. Re-evaluate imbalance. If it is fixed, keep this move and quit. If it is better, keep this move and look for another. If it is not better, put the load back to its original rotation and look for another.

If there are loads waiting to be added, Add Loads.
    If adding single phase loads, add them to the lightest input phase.

If adding three phase loads, add them at their default rotation as specified by the user.

Since there is no way to predict the size of a load before it is connected, there is no way to prevent an added load from creating an overload. Some protection against this is provided by the "headroom" parameter. The system will not allow new connections if the available ampacity is below the specified headroom.

In accordance with an exemplary embodiment, the IPMDS 100 operates as described hereinafter with regards to the following examples.

Example 1

Figure 7A:
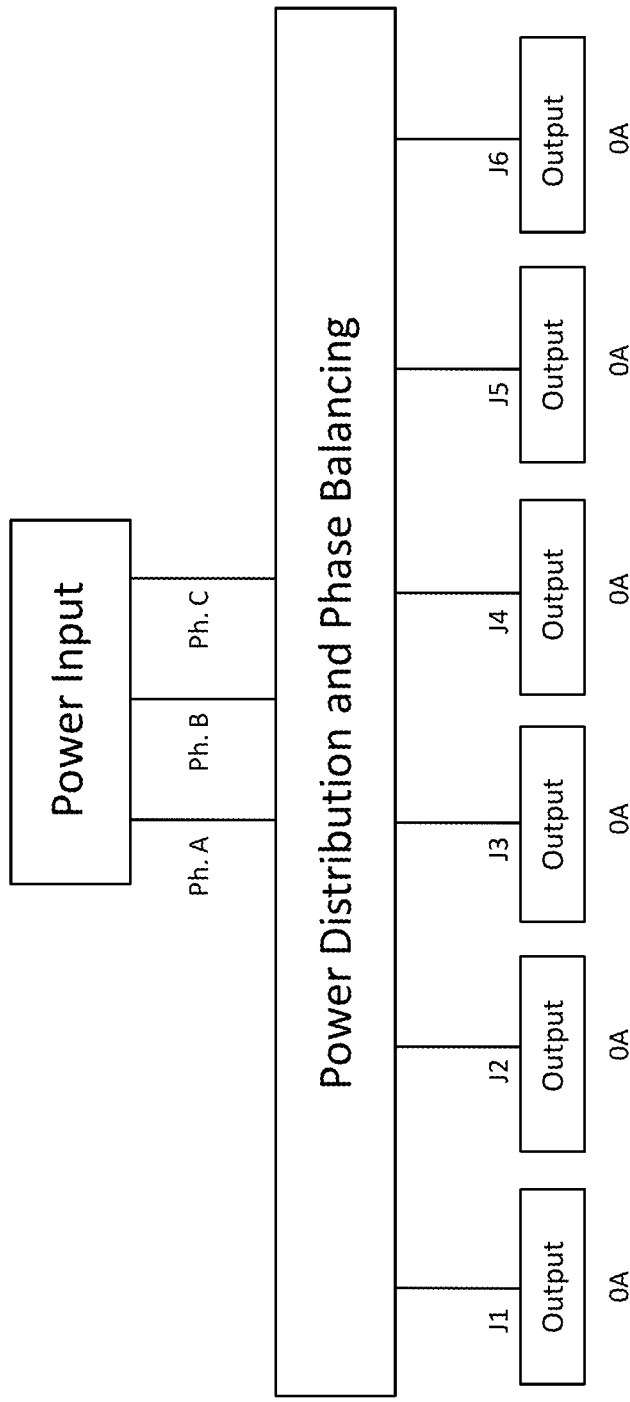
FIG. 7A is a high level schematic block diagram an intelligent power management & distribution system illustrating one embodiment of phase rotation example in accordance with the present invention.
Figure 7B:
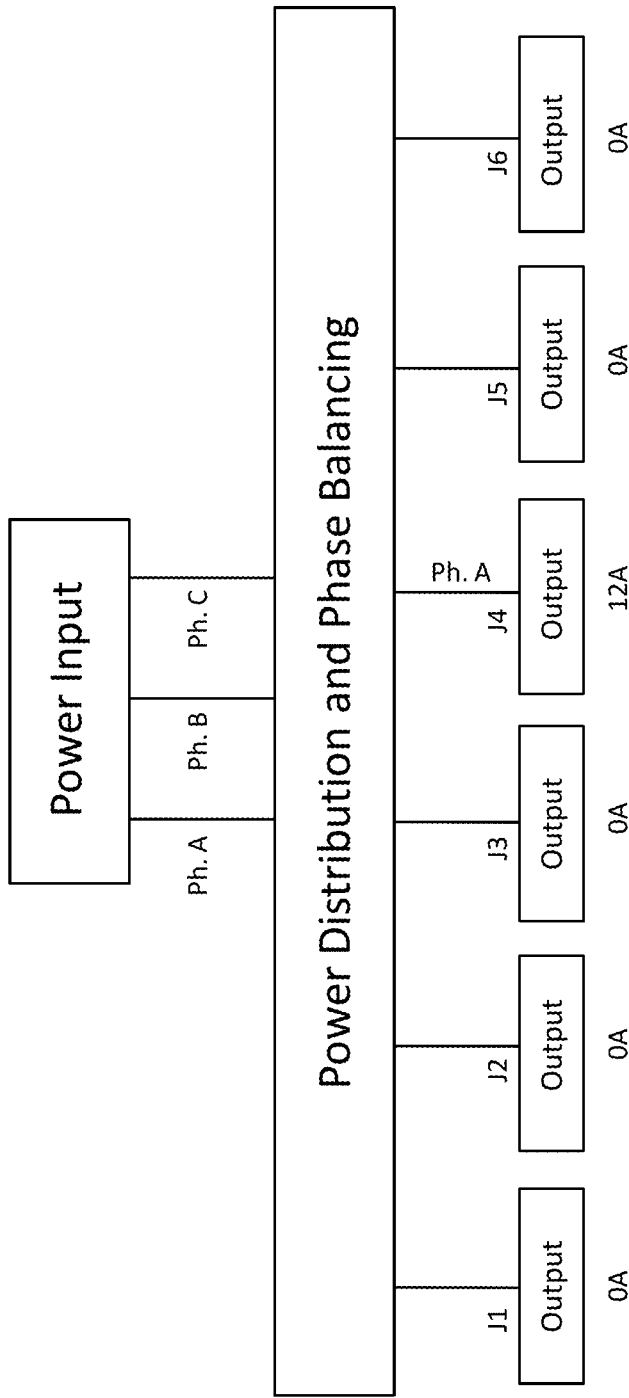
FIG. 7B is a high level schematic block diagram an intelligent power management & distribution system illustrating the phase rotation example of FIG. 7A.
Figure 7C:
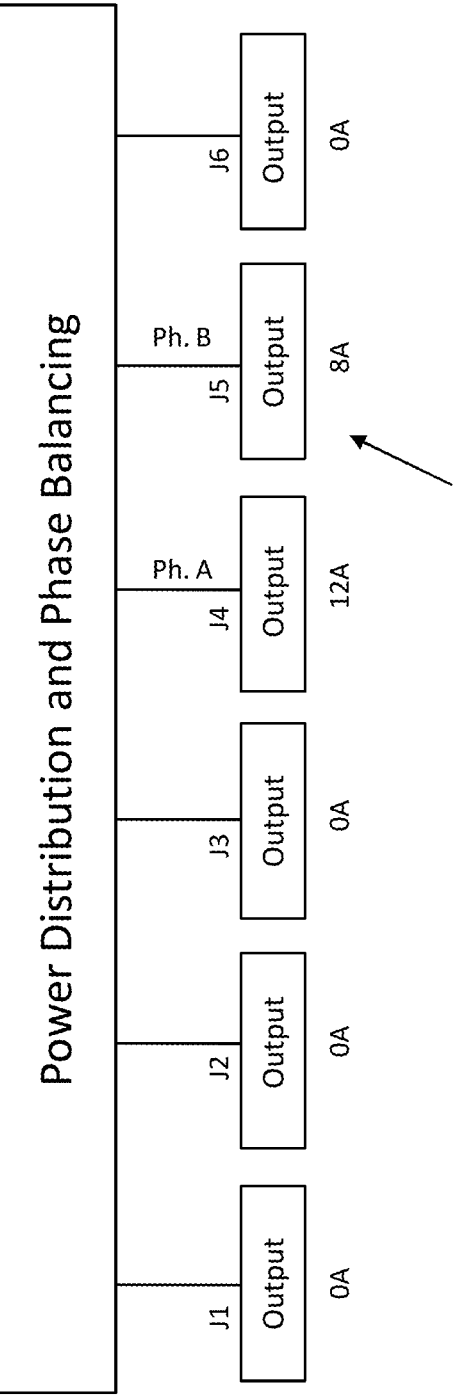
FIG. 7C is a high level schematic block diagram an intelligent power management & distribution system illustrating the phase rotation example of FIG. 7A.

Referring to FIG. 7A-FIG. 7F, the operation of the IMPDS 100, 200, 300 is described with reference to the following example. Consider the situation where the IMPDS is configured with one power input 500 and six power outputs J146, where the power input is a 3-phase input and each of the power outputs J1-J6 are single-phase outputs. FIG. 7A illustrates the IPMDS when no loads are attached. FIG. 7B illustrates the IPMDS when a load is attached to an output, say J4. In this case, the load is a 12 amp load and the IPC assigns an arbitrary phase to the output, say Phase A. To accomplish this, the IPC instructs the OAPB for J4 to activate the relays 116 for Phase A of output J4. Accordingly, there is now a 12 amp load on Phase A of power output J4. FIG. 7C illustrates the IPMDS when an additional load is attached to another output, say J5. In this case, the load is an 8 amp load and the IPC assigns an unused (or least loaded) phase to the output, say Phase B. It should be appreciated that the IPC could have assigned Phase C as that phase is currently unused. To accomplish this, the IPC instructs the OAPB for J5 to activate the relays 116 for Phase B of output J5. Accordingly, there is now a 12 amp load on Phase A of power output J4 and an 8 amp load on Phase B of power output J5.

Figure 7D:
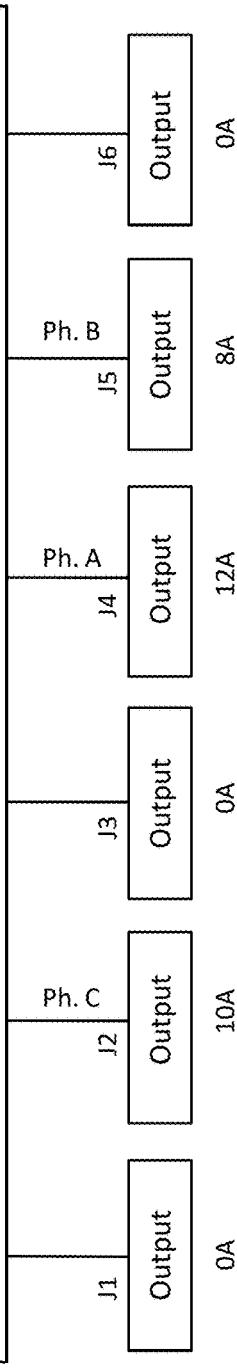
FIG. 7D is a high level schematic block diagram an intelligent power management & distribution system illustrating the phase rotation example of FIG. 7A.
Figure 7E:
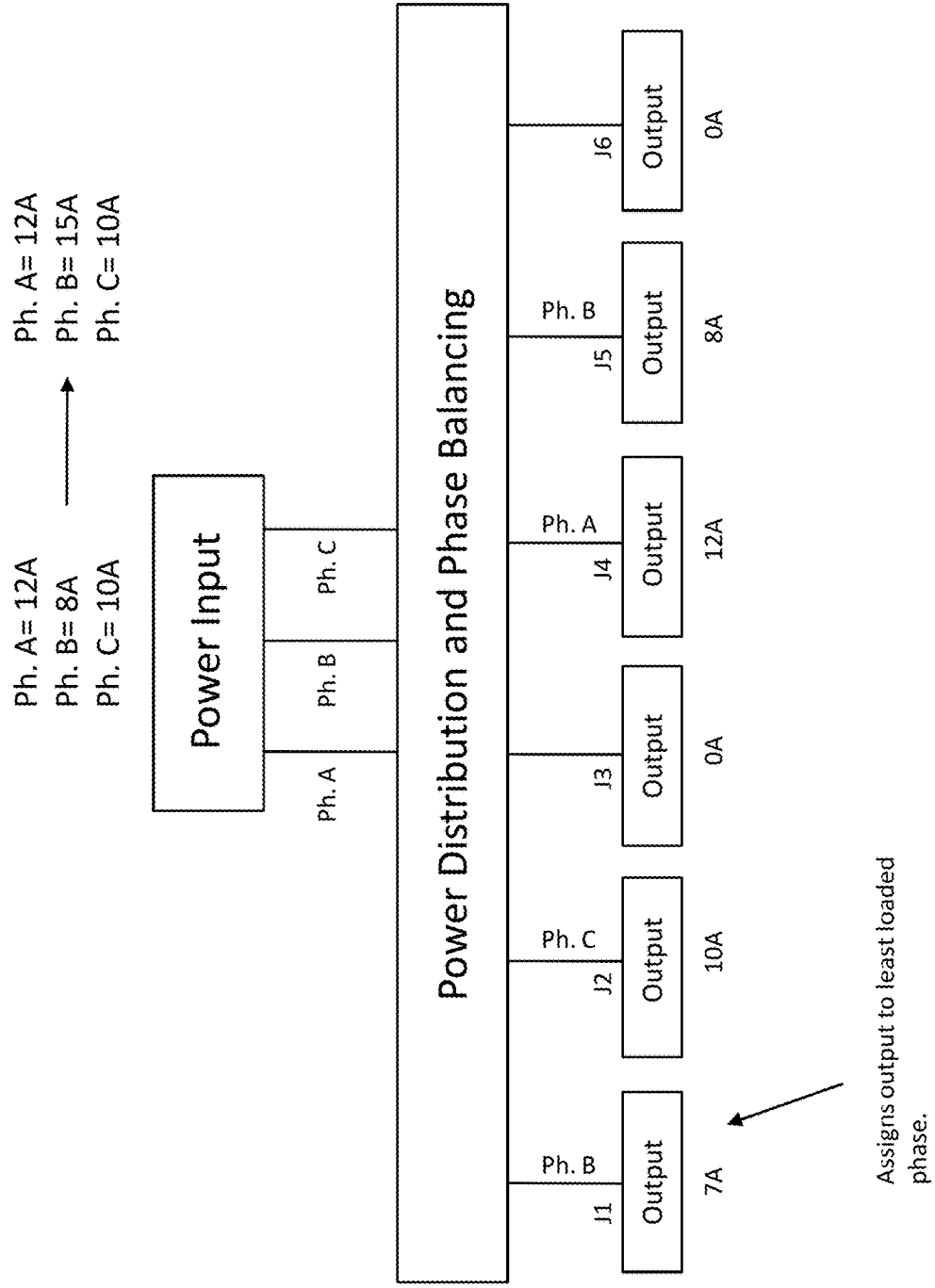
FIG. 7E is a high level schematic block diagram an intelligent power management & distribution system illustrating the phase rotation example of FIG. 7A.

FIG. 7D illustrates the IPMDS when a third load is attached to another output, say J2. In this case, the load is a 10 amp load and the IPC assigns an unused (or least loaded) phase to the output, say Phase C. To accomplish this, the IPC instructs the OAPB for J2 to activate the relays 116 for Phase C of output J2. Accordingly, there is now a 12 amp load on Phase A of power output J4, an 8 amp load on Phase B of power output J5 and a 10 amp load on Phase C of power output J2. At this point, another load is attached to the IPMDS, where FIG. 7E illustrates the IPMDS when a fourth load is attached to another output, say J1. In this case, the load is a lamp load and the IPC assigns the least loaded phase to the output. In this case, Phase B is the least loaded as it only has an 8 amp load while Phase A and Phase C have a 12 amp load and a 10 amp load respectively. To accomplish this, the IPC instructs the OAPB for J1 to activate the relays 116 for Phase B of output J1. Accordingly, there is now a 12 amp load on Phase A, a 15 amp load on Phase B and a 10 amp load on Phase C.

Figure 7F:
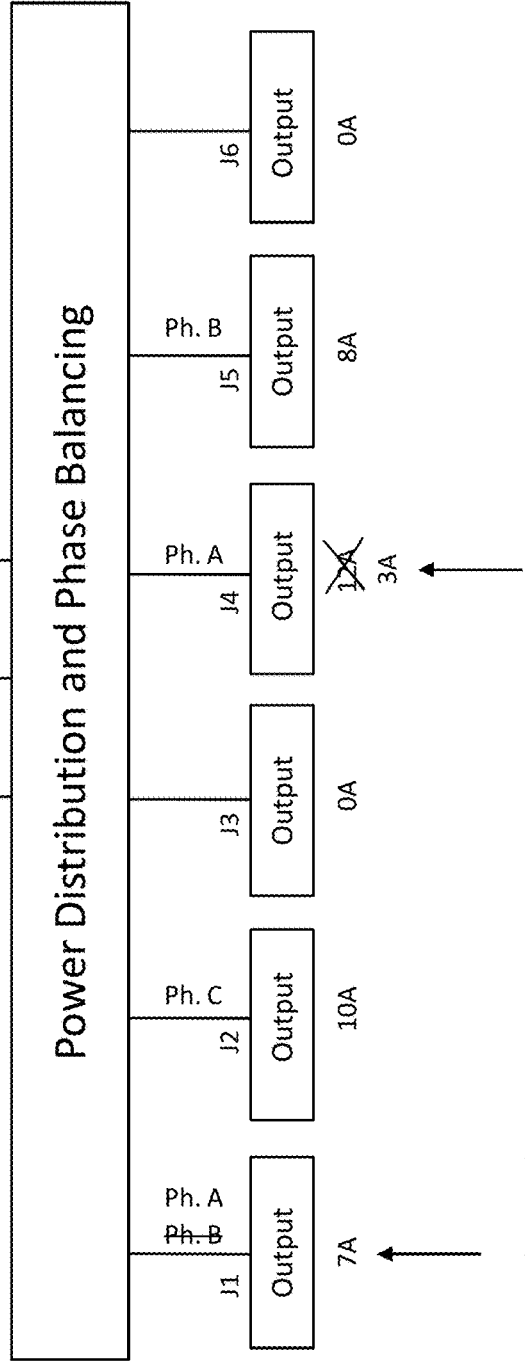
FIG. 7F is a high level schematic block diagram an intelligent power management & distribution system illustrating the phase rotation example of FIG. 7A.

Consider the situation where the load on output J4 begins drawing less current, say 3 amps as opposed to 12 amps. This situation is illustrated in FIG. 7F. In this case, prior to the reduced current draw of J4, the current distribution across the phases would be: Phase A=12 amps, Phase B=15 amps and Phase C=10 amps and the system would be relatively "balanced." However, after the reduced current draw of J4, the current distribution across the phases would be: Phase A=3 amps, Phase B=15 amps and Phase C=10 amps and the system would be less "balanced." In order to account for this imbalance, the IPC would try to distribute the current draw across the phases as equally as possible. In this case, the IPC may assign switch the load on J1 which is lamps on Phase B to Phase A. This would result in the current distribution across the phases being: Phase A=10 amps, Phase B=8 amps and Phase C=10 amps and the system would be more "balanced." Again, to accomplish this, the IPC would instruct the OAPB for J1 to deactivate the relays 116 for Phase B of output J1 and activate the relays 116 for Phase A of output J1. It should be appreciated that this 'balancing' approach would get more complicated as the number of loads attached are increased and if the loads attached are 3-phase loads. However, the above approach of using the least loaded phase can be extrapolated out by the number of power outputs and loads as needed.

Example 2

Figure 8A:
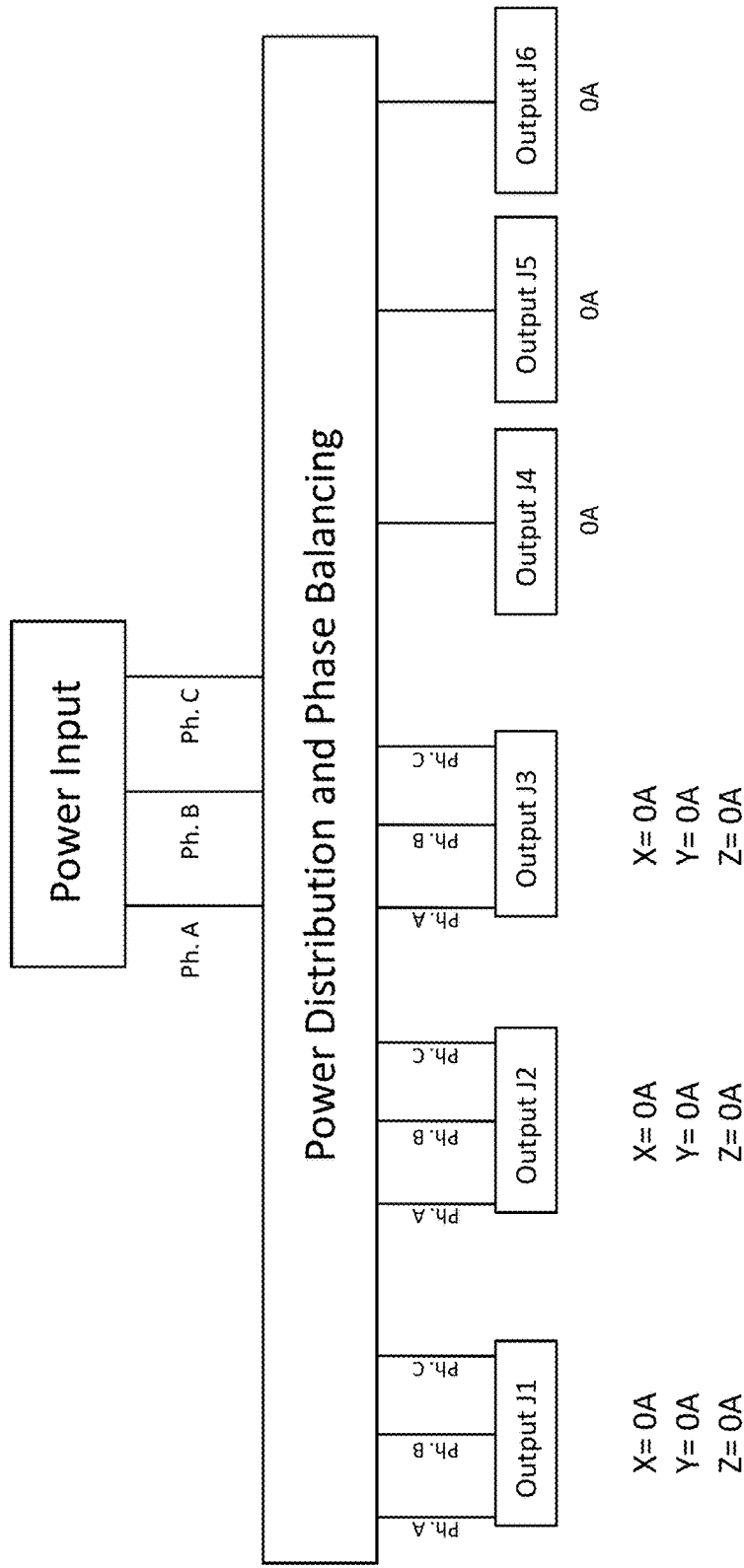
FIG. 8A is a high level schematic block diagram an intelligent power management & distribution system illustrating another embodiment of phase rotation example in accordance with the present invention.
Figure 8B:
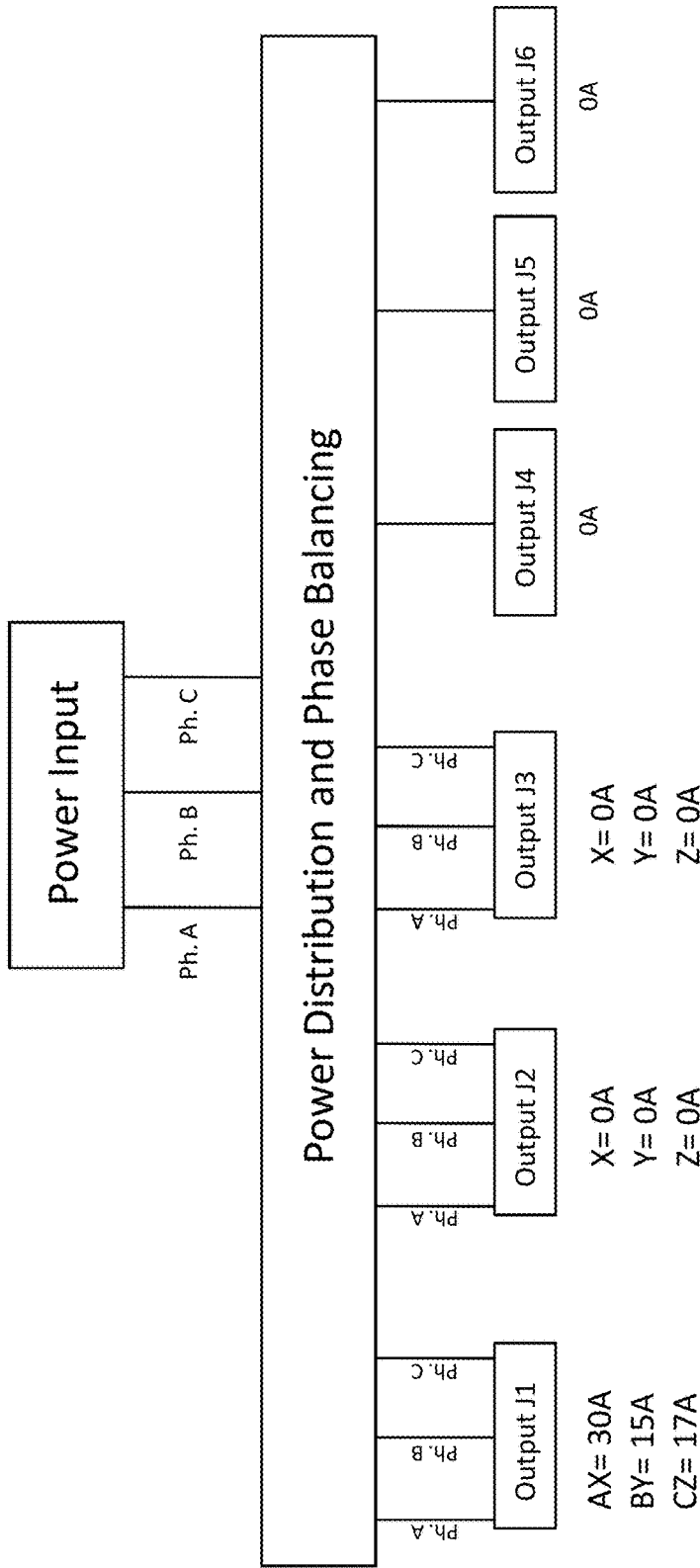
FIG. 8B is a high level schematic block diagram an intelligent power management & distribution system illustrating the phase rotation example of FIG. 8A.

Referring to FIG. 8A-FIG. 8F, the operation of the IMPDS 100, 200, 300 is described with reference to another example as follows. Consider the situation where the IMPDS is configured with one power input 600 and six power outputs J146, where the power input is a 3-phase input and three of the power outputs J1-J3 are 3-phase outputs and three of the power outputs J4-J6 are single-phase outputs. FIG. 8A illustrates the IPMDS when no loads are attached. FIG. 8B illustrates the IPMDS when a load is attached to an output, say J1. In this case, the load is a 62 amp load which is distributed across the phases of output of J1 as follows: Phase A=30 amps, Phase B=15 amps and Phase C=17 amps. FIG. 8C illustrates the IPMDS when an additional load is attached to another output, say J5. In this case, the load is a 5 amp load and the IPC assigns the least loaded phase to the output J5. In this case, because Phase B is the least loaded phase, then the IPC assigns the load at output J5 to Phase B. To accomplish this, the IPC instructs the OAPB for J5 to activate the relays 116 for Phase B of output J5. Accordingly, the phase distribution after the load is added to J5 is Phase A=30 amps, Phase B=20 amps and Phase C=17 amps.

Figure 8D:
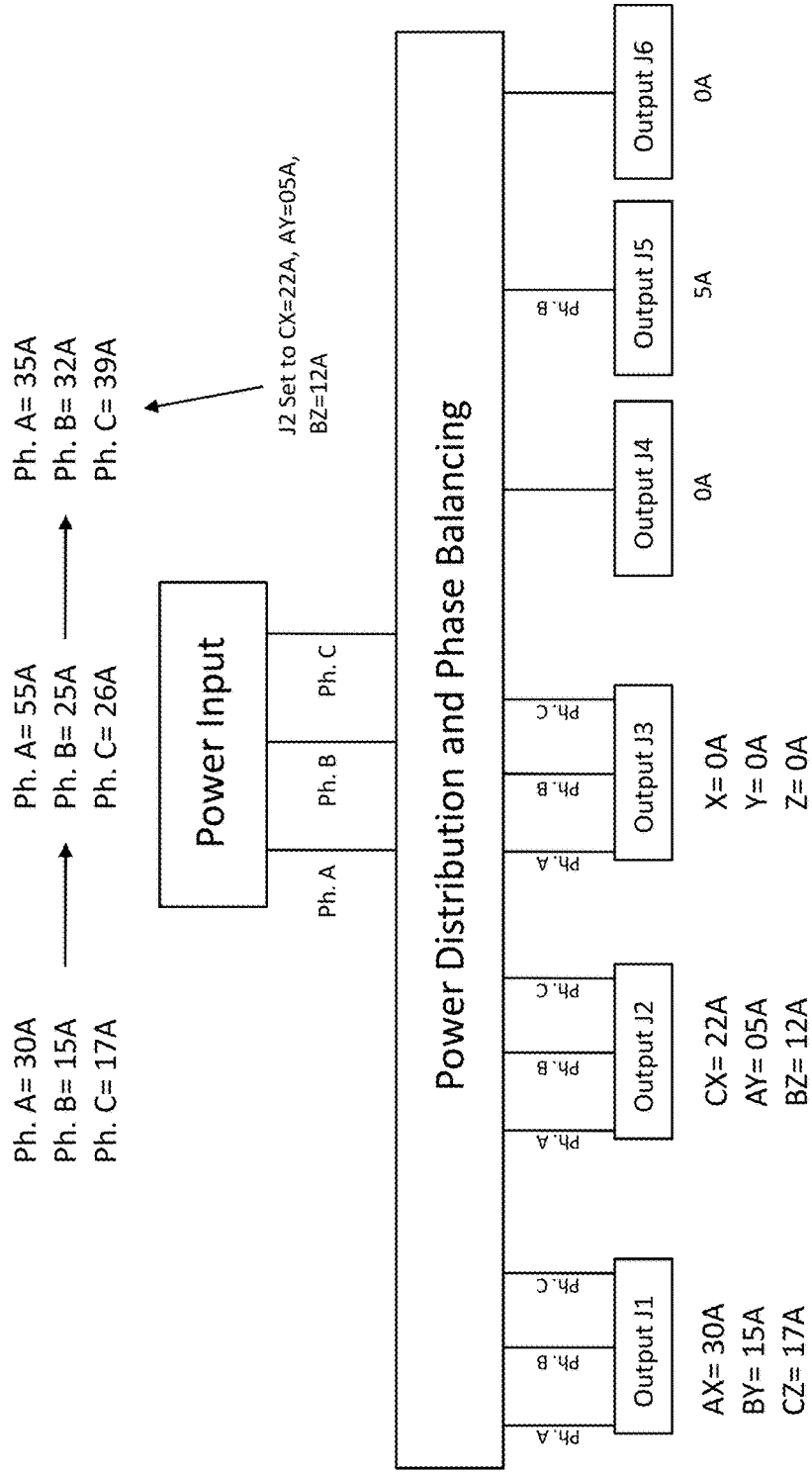
FIG. 8D is a high level schematic block diagram an intelligent power management & distribution system illustrating the phase rotation example of FIG. 8A.

FIG. 8D illustrates the IPMDS when a third load is attached to another output, say J2. In this case, the load is a 3-phase, 39 amp load which is initially distributed across the phases of the power output J2 as follows: Phase A=25 amps, Phase B=5 amps and Phase C=9 amps. This results in a system phase distribution of Phase A=55 amps, Phase B=25 amps and Phase C=26 amps which is unbalanced towards Phase A. Accordingly, because Phase A has a total load of 55 amps, while both Phase B and Phase C have significantly lower loads (Phase B=25 amps, Phase C=26 amps) that are approximately equal to each other, the IPC will reduce the total load on Phase A and distribute that reduced load across Phase B and Phase C. Accordingly, the IPC instructs the OAPB for J2 to distribute the current load at J2 follows: Phase A=05 amps, Phase B=12 amps and Phase C=22 amps. This adjustment results in a system phase distribution of Phase A=35 amps, Phase B=32 amps and Phase C=39 amps which is balanced.

In accordance with the present invention, the relays 116 are configured such that Phase A, Phase B and Phase C can be rotated and reassigned as necessary. This advantageously allows modifications of phase assignments as follows. Consider the situation where a modifiable Phase A, Phase B and Phase C are to be connected to a hard wired Line Phase X, Line Phase Y and Line Phase Z. Accordingly, the potential ABC/XYZ line phase combinations are: XA-YB-ZC; XA-YC-ZB; XB-YA-ZC; XB-YC-ZA; XC-YA-ZB; and XC- YB-ZA. It should be appreciated that the phase combinations XA-YB-ZC, XB-YC-ZA and XC-YA-ZB (i.e. ABC, BCA and CAB) are the phase combinations that would not result in a phase reversal. Thus, these phase combinations are the only combinations discussed herein with regards to the present invention. However, it is contemplated that for situations where phase reversal is desired, the present invention can be used to implement those phase combinations. It should be appreciated that as referred to herein, a "fixed-rotation" connector/outlet is an outlet that is a 'regular' outlet with the phase balancing capability.

In accordance with another embodiment of the invention, it is contemplated that the phase rotation/reassignment may be accomplished using only transistors (e.g. NFET, PFET, MOSFET) ("SSRs") as opposed to a solid-state relay/electromechanical relay combination as described above. It should be appreciated that Referring to FIG. 9, one embodiment of a circuit for accomplishing a phase rotation or exchange without the use of an electromechanical relay is shown using NFET transistors. As shown, the SSR's 900 may be constructed from two N-Channel Field Effect Transistors (NFET) 902 with a body diode 904 included. Accordingly, this configuration advantageously allows current to flow in both directions when in the "ON" state, but only in one direction when in the "OFF" state.

Figure 9:
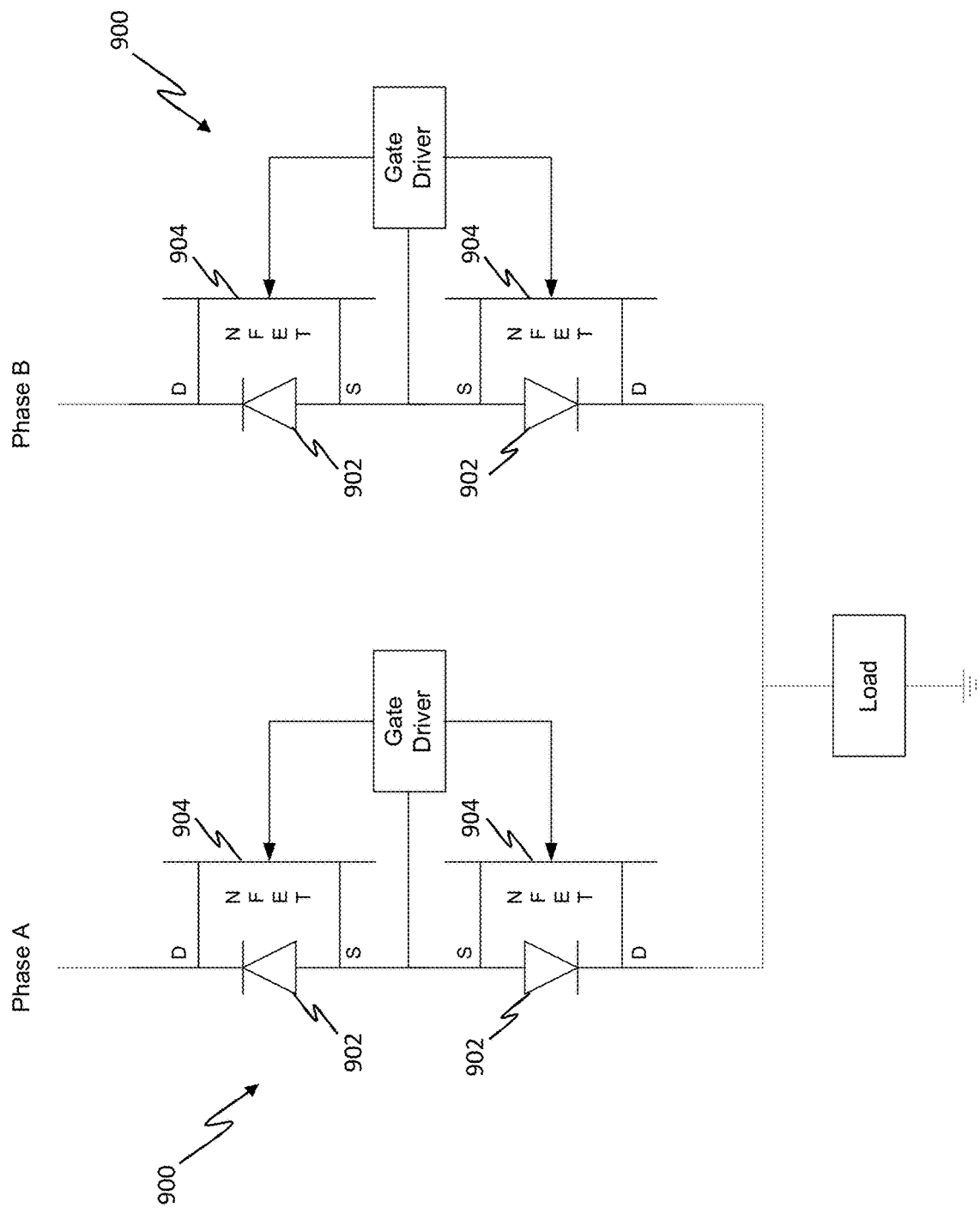
FIG. 9 is a schematic block diagram illustrating one embodiment of a circuitry for accomplishing phase rotation/exchange for the intelligent power management & distribution system of the present invention.
Figure 10:
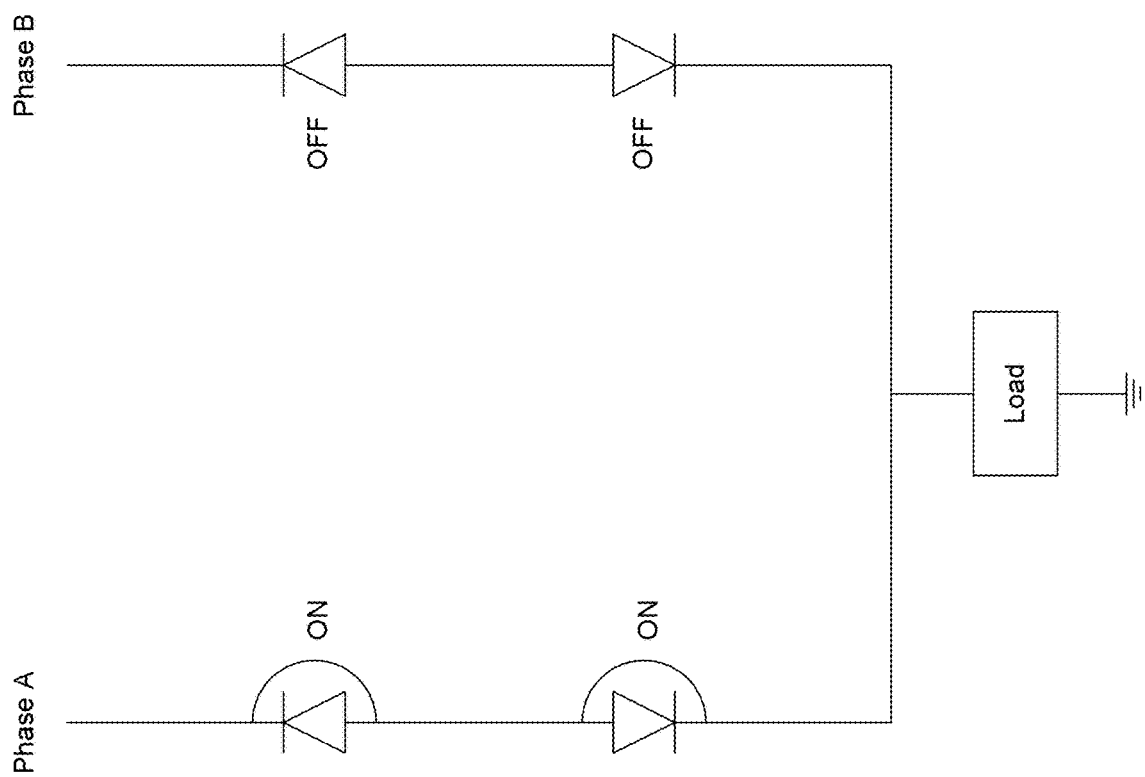
FIG. 10 is a schematic block diagram illustrating one embodiment of a circuitry for accomplishing phase rotation/exchange for the intelligent power management & distribution system of the present invention.
Figure 11:
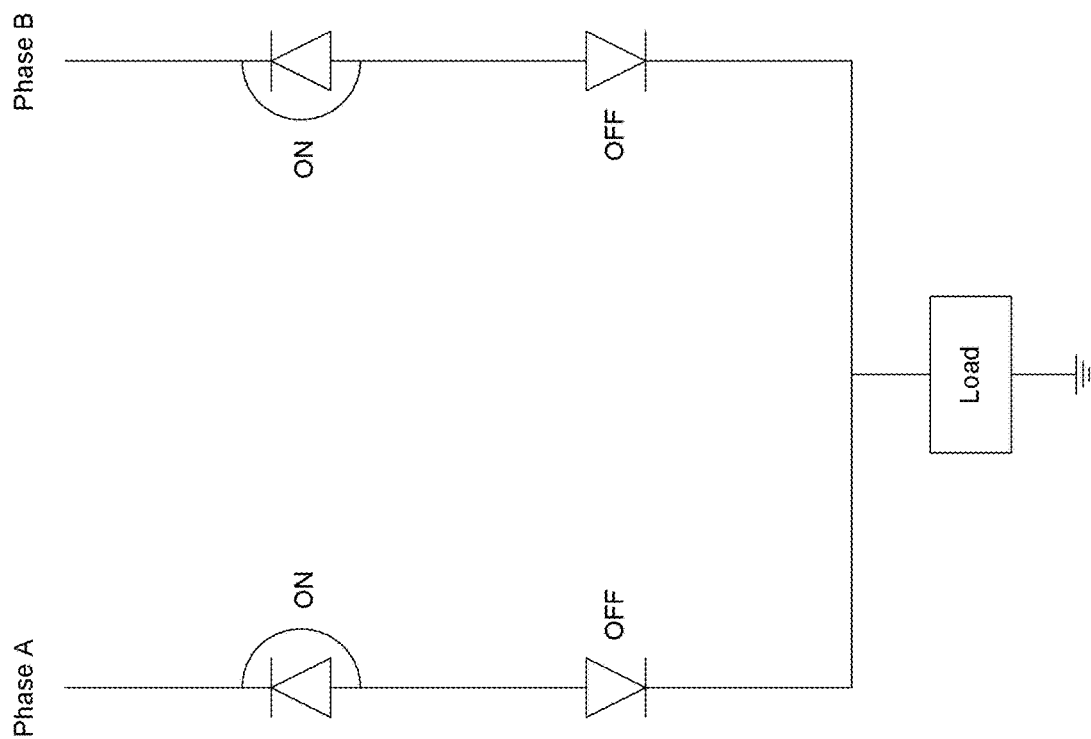
FIG. 11 is a schematic block diagram illustrating one embodiment of a circuitry for accomplishing phase rotation/exchange for the intelligent power management & distribution system of the present invention.

FIG. 10 illustrates a MOSFET equivalent circuit for the NFET circuitry of FIG. 9. As can be seen, Phase A is connected to the load and Phase B is isolated. It should be appreciated that for an active FET (i.e. turned on) the resistance is nearly zero, resulting in 'almost' a "short circuit." However, when the FET is inactive (i.e. turned off) the resistance is very high and essentially only the diodes are the active circuit elements (represented as back-to-back diodes) and they effectively isolate the load from Phase B. FIG. 11, illustrates SSR devices for Phase A and Phase B, where the two upper FETs are energized and the devices act like a traditional diode OR circuit.

Figure 12:
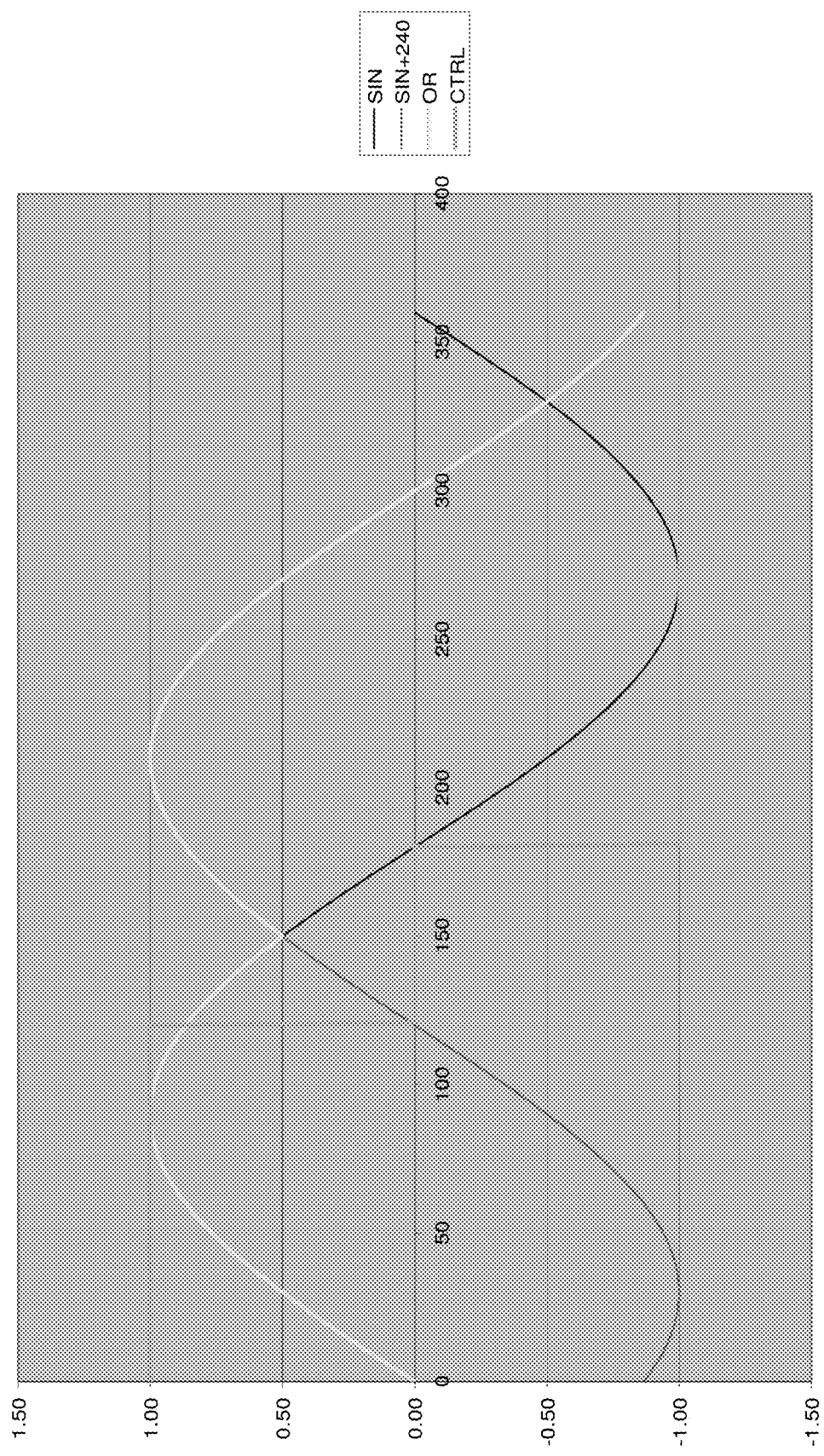
FIG. 12 is a graph illustrating control strategy and power characteristics, in accordance with one embodiment of the invention.

In accordance with the present invention, it is contemplated that these design characteristics are useful to create a smooth, fast phase rotation/exchange. This can be illustrated with regards to the following example. In accordance with one embodiment, FIG. 12 illustrates the power switching characteristics of the SSR devices described above. In this embodiment, a first trace 950 illustrates a desired control strategy, a second trace 952 illustrates Phase A and a third trace 954 illustrates Phase B. Initially, the control strategy is to have the SSRs for Phase A to be turned on and the SSRs for Phase B to be turned off. This is represented by the control trace being shown in the active position for Phase A (i.e. located at 1.00). Thus, referring to FIG. 9, the SSRs for Phase B are inactive (i.e. turned OFF), the SSRs for Phase A are active (i.e. turned ON) and Phase A is carrying the load.

Referring to FIG. 12, it can be seen that the two phase voltages are both positive in the range of 120 to 180 degrees. Accordingly, to take advantage of this the control strategy is to have either Phase A or Phase B turned on in this range (i.e. A OR B) which may be accomplished by turning each of the SSRs 'half-on" as shown in FIG. 11. This control strategy is represented as the control trace 950 being shown in the zero position (i.e. located at 0). In this embodiment, the phase rotation/exchange occurs via the body diodes when the two voltages (for Phase A and Phase B) cross at 150 degrees. Before the second trace 952 goes negative at 180 degrees, the control strategy changes to have Phase A inactive (i.e. turned OFF) and Phase B active (i.e. turned ON). This is represented by the control trace being shown in the active position for Phase B (i.e. located at −1.00).

Figure 13:
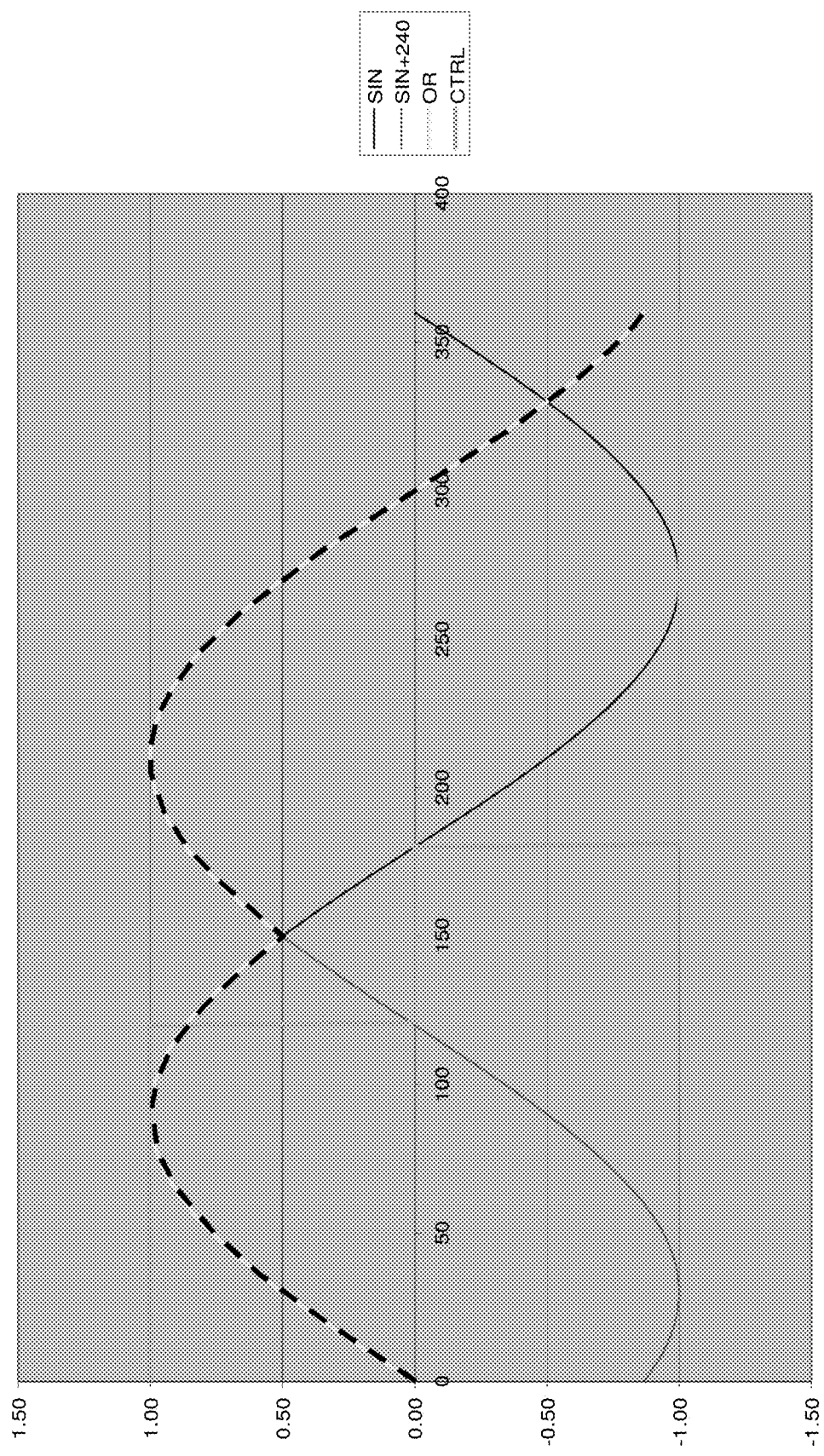
FIG. 13 is a graph illustrating control strategy and power characteristics, in accordance with one embodiment of the invention.
Figure 14:
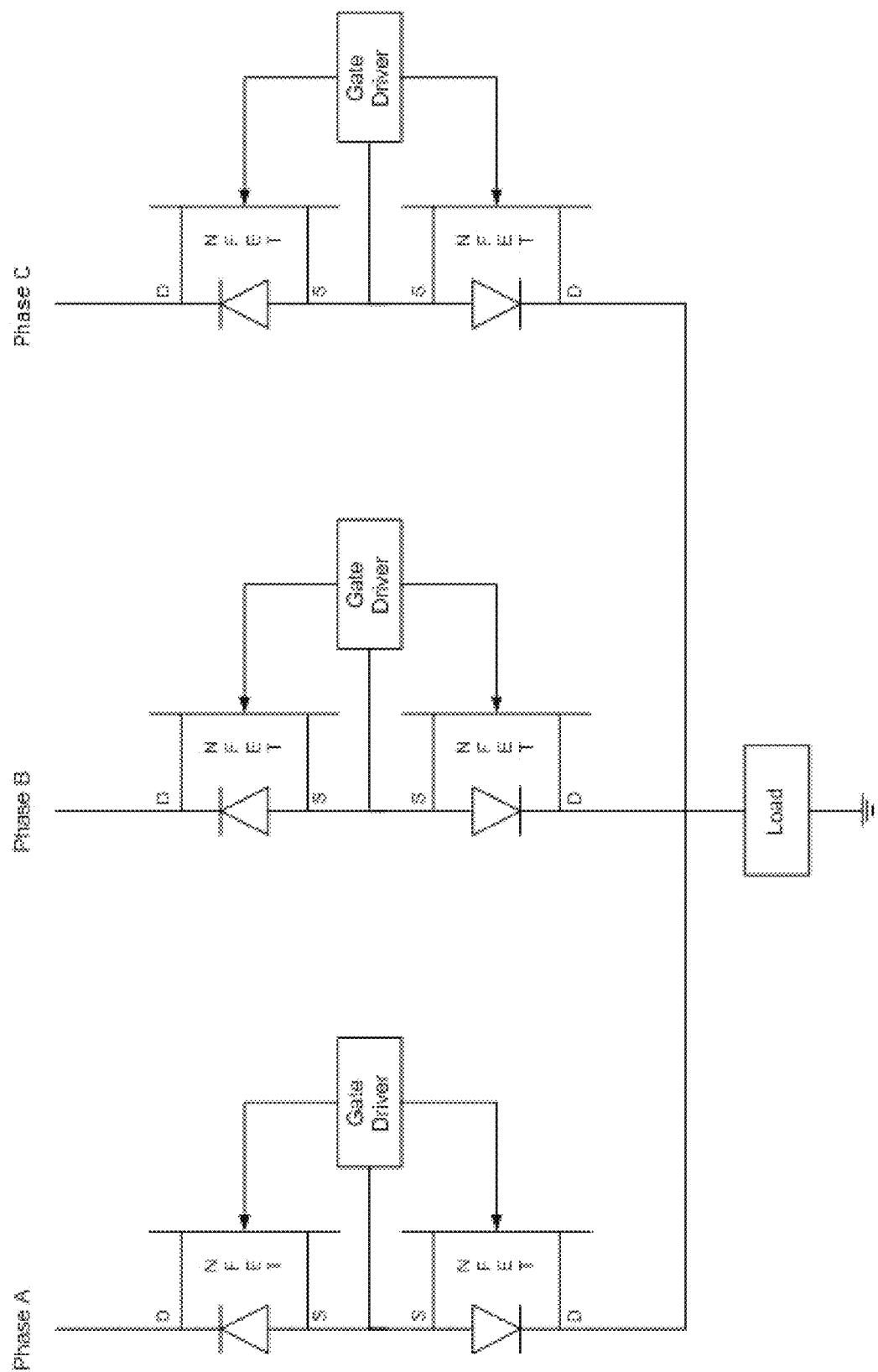
FIG. 14 is a schematic block diagram illustrating one embodiment of a circuitry for accomplishing phase rotation/exchange for the intelligent power management & distribution system of the present invention.

Referring to FIG. 13, it should be appreciated that the dotted trace illustrates the resultant action. With both phase voltages positive, the two diodes act as an OR circuit that passes the higher voltage and blocks the lower one. When the phase voltages cross each other, the load switches from Phase-A to Phase-B. Advantageously, there is ZERO time when the load is not driven by one of the phase voltages, i.e. a true zero-time exchange. FIG. 14 illustrates one embodiment of a phase exchange device (i.e. circuit) for 3-phases power (Phase A, Phase B, Phase C).

In accordance with the present invention, the processing of the method of the invention may be implemented, wholly or partially, by a controller operating in response to a machine-readable computer program. In order to perform the prescribed functions and desired processing, as well as the computations therefore (e.g. execution control algorithm(s), the control processes prescribed herein, and the like), the controller may include, but not be limited to, a processor(s), computer(s), memory, storage, register(s), timing, interrupt(s), communication interface(s), and input/output signal interface(s), as well as combination comprising at least one of the foregoing.

Moreover, the method of the present invention may be embodied in the form of a computer or controller implemented processes. The method of the invention may also be embodied in the form of computer program code containing instructions embodied in tangible media, such as floppy diskettes, CD-ROMs, hard drives, and/or any other computer-readable medium, wherein when the computer program code is loaded into and executed by a computer or controller, the computer or controller becomes an apparatus for practicing the invention. The invention can also be embodied in the form of computer program code, for example, whether stored in a storage medium, loaded into and/or executed by a computer or controller, or transmitted over some transmission medium, such as over electrical wiring or cabling, through fiber optics, or via electromagnetic radiation, wherein when the computer program code is loaded into and executed by a computer or a controller, the computer or controller becomes an apparatus for practicing the invention. When implemented on a general-purpose microprocessor the computer program code segments may configure the microprocessor to create specific logic circuits.

It should be appreciated that while the invention has been described with reference to an exemplary embodiment, it will be understood by those skilled in the art that various changes, omissions and/or additions may be made and equivalents may be substituted for elements thereof without departing from the spirit and scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

What is claimed is:

1. A power management and distribution system, comprising:
    a power input configured to receive three-phase electrical power from an external power source;

a first power output;

a second power output; and a power handling means, wherein the power handling means includes a power controller, a Phase Balancing Module and a plurality of relays connected to each of the phases of the three-phase power drawn by a first electrical load and a second electrical load, and wherein each of the plurality of relays includes a relay pair connected in parallel and a circuit breaker connected in series with the relay pair, wherein the circuit breaker is located between the input power and the relay pair, and wherein the power handling means is configured to, monitor the current for each phase of the three-phase power drawn by a first electrical load connected to the first power output and a second electrical load connected to the second power output;

determine the total current drawn on each phase of the three-phase electrical power drawn by the first electrical load and the second electrical load;

identify whether the total current is out of balance with respect to the current for each of the phases drawn by the first electrical load and the second electrical load; and modify the current for each of the phases drawn by the first electrical load and the second electrical load to substantially balance the total current drawn for each of the three-phases.

2. The power management and distribution system of claim 1, wherein the power handling means includes a plurality of relays connected to each of the phases of the three-phase power to the first power outlet and the second power outlet, wherein the connection between the plurality of relays and the first power outlet and the second power outlet allow the separate current phases for the first power outlet to be connected to the separate current phases for the second power outlet.

3. The power management and distribution system of claim 1, wherein the relay pair includes at least one of, a plurality of electromechanical relays and a plurality of solid-state relays, and a plurality of transistors.

4. The power management and distribution system of claim 1, wherein the relay pair include an electromechanical relay and a solid-state relay.

5. The power management and distribution system of claim 4, wherein the power handling means includes a current measuring device configured to measure the current for each phase of the power being drawn from the first power output for the first electrical load and the second power output for the second electrical load.

6. The power management and distribution system of claim 5, wherein the power handling means includes a processing device configured to analyze the measured current and determine a resultant phase current configuration responsive to predetermined parameters.

7. The power management and distribution system of claim 5, wherein the power handling means includes a phase balancing device configured to operate the plurality of relays responsive to the resultant phase current configuration.

8. A power management and distribution system, comprising:

an electrical power input for receiving three-phase power from an external power source;

a first electrical power outlet;

a second electrical power outlet;

a current measuring device for measuring the current on all phases of electrical power being drawn by electrical loads connected to the first electrical power outlet and the second electrical power outlet;

a processing device for analyzing the measured current for all phases of electrical power being drawn by the electrical loads; and a phase balancing device for modifying the phase arrangement of the phases of the electrical power being drawn by the electrical loads connected to the first electrical power outlet and the second electrical power outlet to substantially balance the current for each phase, wherein the phase balancing device includes a plurality of relays, wherein each of the plurality of relays include a relay pair connected in parallel and a circuit breaker connected in series with the relay pair, wherein the circuit breaker is located between the electrical power input and the relay pair.

9. The power management and distribution system of claim 8, wherein the plurality of relays are connected to each of the phases of the three-phase power drawn by from the first power outlet and the second power outlet.

10. The power management and distribution system of claim 9, wherein each relay pair of the plurality of relay pairs include an electromechanical relay and a solid-state relay.

11. The power management and distribution system of claim 10, wherein the processing device is configured to analyze the measured current and determine a resultant phase current configuration responsive to predetermined parameters.

12. The power management and distribution system of claim 11, wherein the phase balancing device is configured to operate the plurality of relays responsive to the resultant phase current configuration.

13. A method for managing and distributing power using a power management and distribution system, wherein the power management and distribution system includes an electrical power input for receiving 3-phase power from an external power source, a first electrical power outlet, a second electrical power outlet, a current measuring device for measuring the current on all phases of electrical power being drawn by electrical loads connected to the first electrical power outlet and the second electrical power outlet, a processing device for analyzing the measured current for all phases of electrical power being drawn by the electrical loads and a phase balancing device for modifying the current for each of the phases of the electrical power being drawn by the electrical loads connected to the first electrical power outlet and the second electrical power outlet to substantially balance the total current for each phase across the phases, wherein the phase balancing device includes a plurality of relays each of which include a relay pair connected in parallel and a circuit breaker connected in series with the relay pair, wherein the circuit breaker is located between the input power and the relay pair, the method comprising:

monitoring the current for each phase of the three-phase power drawn by a first electrical load connected to the first power output and a second electrical load connected to the second power output;

determining the total current drawn on each phase of the three-phase electrical power drawn by the first electrical load and the second electrical load;

identifying whether the total current is out of balance with respect to the current for each of the phases drawn by the first electrical load and the second electrical load; and modifying the current for each of the phases drawn by the first electrical load and the second electrical load such that the total current drawn is substantially balanced for each of the three-phases.

14. The method of claim 13, further including connecting the separate current phases for the first electrical outlet to the separate current phases of the second electrical outlet, wherein the plurality of relays connected to each of the phases of the three-phase power to the first electrical power outlet and the second electrical power outlet, wherein the connection between the plurality of relays and the first electrical outlet and the second electrical outlet allow the separate current phases for the first electrical outlet to be connected to the separate current phases for the second electrical outlet.

15. The method of claim 13, further including connecting the phase balancing device to each of the phases of the three-phase power drawn by the first electrical load and the second electrical load, wherein the phase balancing device includes a plurality of relays connected to each of the phases of the three-phase power drawn by the first electrical load and the second electrical load, wherein the relay pair includes at least one of, a plurality of electromechanical relays and a plurality of solid-state relays, and a plurality of transistors.

16. The method of claim 15, further including measuring the current for each phase of the power being drawn from the first power output for the first electrical load and the second power output for the second electrical load, wherein the current measuring device is configured to measure the current for each phase of the power being drawn from the first power output for the first electrical load and the second power output for the second electrical load.

17. The method of claim 16, further including analyzing the measured current and determining a resultant phase current configuration responsive to predetermined parameters, wherein the processing device is configured to analyze the measured current and determine a resultant phase current configuration responsive to predetermined parameters.

18. The method of claim 17, further including operating the plurality of relays responsive to the resultant phase current configuration, wherein the phase balancing device is configured to operate the plurality of relays responsive to the resultant phase current configuration.

* * * * *